(12) United States Patent
Ishiguro et al.

(10) Patent No.: US 11,257,661 B2
(45) Date of Patent: Feb. 22, 2022

(54) PLASMA PROCESSING APPARATUS

(71) Applicant: HITACHI HIGH-TECH CORPORATION, Tokyo (JP)

(72) Inventors: Masaki Ishiguro, Tokyo (JP); Masahiro Sumiya, Tokyo (JP); Shigeru Shirayone, Tokyo (JP); Kazuyuki Ikenaga, Tokyo (JP); Tomoyuki Tamura, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 391 days.

(21) Appl. No.: 14/788,759

(22) Filed: Jun. 30, 2015

(65) Prior Publication Data
US 2016/0027615 A1 Jan. 28, 2016

(30) Foreign Application Priority Data

Jul. 25, 2014 (JP) .............................. JP2014-151449
Mar. 10, 2015 (JP) .............................. JP2015-046627

(51) Int. Cl.
*H01J 37/32* (2006.01)

(52) U.S. Cl.
CPC .. *H01J 37/32532* (2013.01); *H01J 37/32082* (2013.01); *H01J 37/3299* (2013.01); *H01J 37/32146* (2013.01); *H01J 37/32706* (2013.01); *H01J 37/32935* (2013.01)

(58) Field of Classification Search
None
See application file for complete search history.

(56) References Cited

U.S. PATENT DOCUMENTS

| | | | |
|---|---|---|---|
| 5,891,349 A | 4/1999 | Tobe et al. | |
| 6,333,246 B1 | 12/2001 | Narita et al. | |
| 6,373,681 B2 * | 4/2002 | Kanno | H01L 21/6833 361/234 |
| 7,224,568 B2 | 5/2007 | Ishimura et al. | |
| 7,504,040 B2 | 3/2009 | Iijima et al. | |

(Continued)

FOREIGN PATENT DOCUMENTS

| | | |
|---|---|---|
| JP | H09-54130 A | 2/1997 |
| JP | H10150100 A | 6/1998 |

(Continued)

OTHER PUBLICATIONS

Office Action dated Jul. 15, 2016 for a related Korean Application No. 10-2015-0091294.

(Continued)

*Primary Examiner* — Aiden Lee
(74) *Attorney, Agent, or Firm* — Miles & Stockbridge, P.C.

(57) ABSTRACT

A plasma processing apparatus includes: a plasma processing chamber; a radio frequency power source; a sample stage on which a sample is mounted; an electrode which is arranged inside the sample stage and electrostatically chucks the sample; a DC power source which applies a DC voltage to the electrode; and a control device which controls an output voltage of the DC power source so that an electric potential difference between an electric potential of the sample and an electric potential of an inner wall of the plasma processing chamber is reduced to an electric potential difference within a predetermined range during interruption of plasma discharge.

7 Claims, 11 Drawing Sheets

(56) References Cited

U.S. PATENT DOCUMENTS

| | | | | |
|---|---|---|---|---|
| 2006/0171093 | A1* | 8/2006 | Ishimura | H01J 37/321 |
| | | | | 361/234 |
| 2007/0148364 | A1* | 6/2007 | Iijima | H01L 21/31116 |
| | | | | 427/458 |
| 2013/0081761 | A1 | 4/2013 | Sawada | |
| 2015/0228457 | A1 | 8/2015 | Yamashita et al. | |

FOREIGN PATENT DOCUMENTS

| | | |
|---|---|---|
| JP | 2001-15581 A | 1/2001 |
| JP | 2001-176958 A | 6/2001 |
| JP | 2002-270576 A | 9/2002 |
| JP | 2003-100720 A | 4/2003 |
| JP | 2004-047511 A | 2/2004 |
| JP | 2007073568 A | 3/2007 |
| JP | 2007-266296 | 10/2007 |
| JP | 2013-191857 | 9/2013 |
| JP | 2013175740 A | 9/2013 |
| JP | 2014-063918 | 4/2014 |
| KR | 10-0232040 B1 | 12/1999 |
| KR | 10-2006-0087358 | 8/2006 |

OTHER PUBLICATIONS

Office Action dated Jul. 26, 2017 for related Korea Application No. 10-2015-0091294 with Machine Translation.
Office Action for related Taiwanese Application No. 104121119 dated Jun. 7, 2016.
Office Action dated Mar. 14, 2018 for Japanese Patent Application No. 2015-046627.
Office Action dated Apr. 7, 2020 in corresponding Japanese Application No. 2019-106669.

* cited by examiner

FIRST EMBODIMENT

SECOND EMBODIMENT

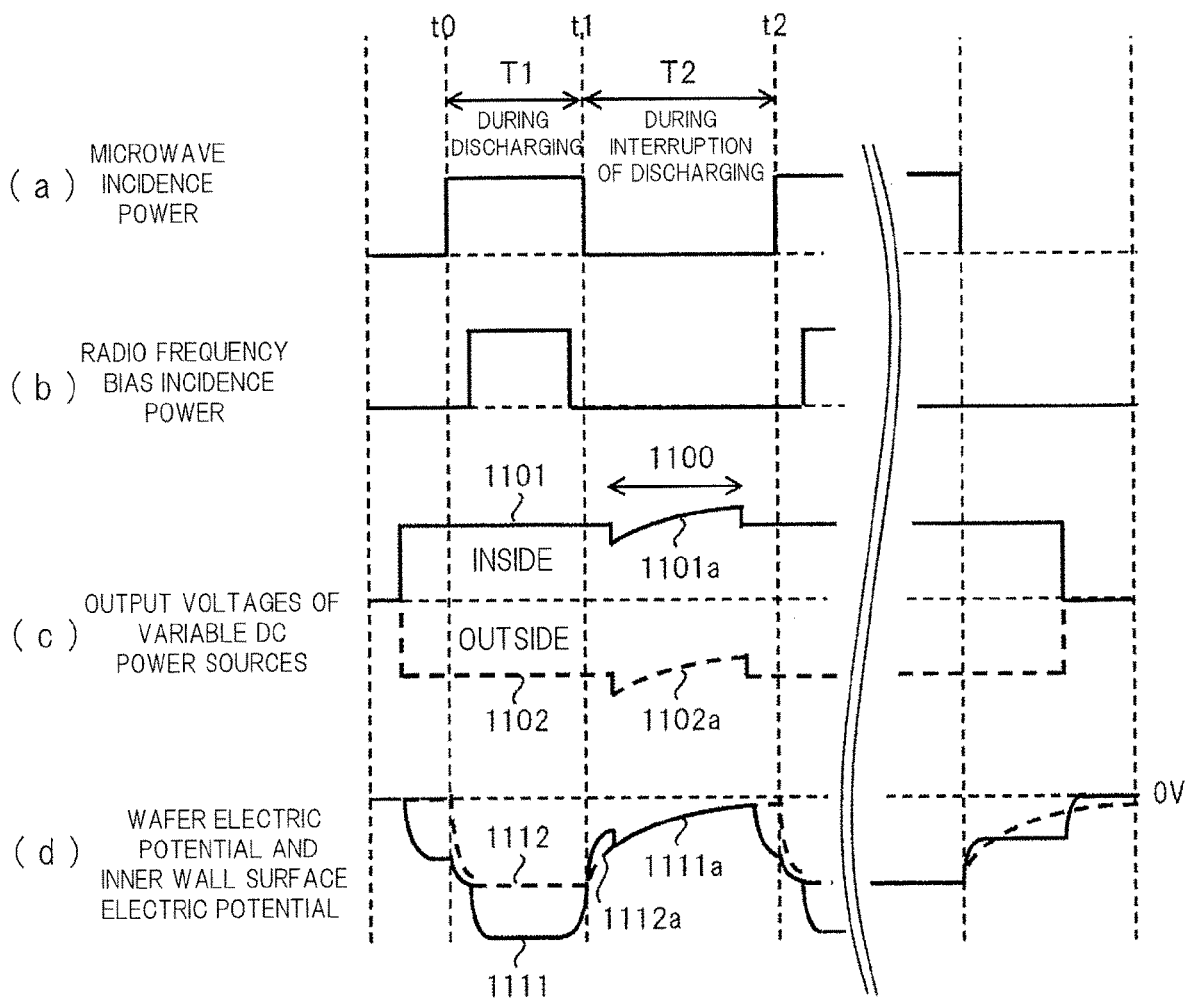

PLASMA PROCESSING APPARATUS

CROSS-REFERENCE TO RELATED APPLICATION

The present application claims priority from Japanese Patent Applications No. 2014-151449 filed on Jul. 25, 2014 and No. 2015-046627 filed on Mar. 10, 2015, the contents of which are hereby incorporated by reference into this application.

TECHNICAL FIELD OF THE INVENTION

The present invention relates to a technology of manufacturing a semiconductor device. In addition, the present invention relates to a plasma processing apparatus suitable for manufacturing a semiconductor device.

BACKGROUND OF THE INVENTION

Plasma etching has been known as one of the plasma processing methods in the manufacture of a semiconductor device. In the plasma etching, a laminated film of a wafer serving as a semiconductor substrate placed on amounting stage in a plasma processing chamber is exposed to plasma, thereby forming minute circuit patterns on the wafer. In this case, conditions of plasma processing, that is, a gas type, a pressure and a power value for plasma generation and others differ depending on a kind of films to be subjected to the plasma processing. Therefore, after processing of a certain film is completed, conditions of the plasma processing need to be changed for the film to be processed next. Since the plasma is unstable during the change of the plasma processing-conditions and corresponding processing, the plasma discharge is interrupted in general in order to prevent unintended progress of the etching.

With respect to the change of plasma processing and conditions accompanied by the interruption of plasma discharge mentioned above, it has been pointed out that dusts in a processing chamber adhere to a wafer due to disappearance of plasma. Hereafter, dusts are described as foreign substances. When an electric potential is being given to the wafer in particular, foreign substances may be attracted and adhere to the wafer by the Coulomb force. When foreign substances adhere to the wafer, the foreign substances obstruct etching, with the result that the yield is deteriorated.

Examples of the previously existing technology with respect to the reduction of foreign substances adhering to the wafer in the plasma processing mentioned above include the following documents.

In the disclosure of Japanese Patent Application Laid-Open Publication No. 2001-15581 (Patent Document 1), on the assumption that most of foreign substances inside a plasma processing chamber are charged negatively, when a wafer is fixed to a holding stage in the processing chamber with a monopole electrostatic chuck electrode, a negative potential is given to the wafer by chucking the wafer with the electrode to which a negative potential is given.

On the other hand, in the disclosure of Japanese Patent Application Laid-Open Publication No. 2003-100720 (Patent Document 2), on the assumption that foreign substances are charged positively, the foreign substances are attracted by a foreign substance removing electrode to which a negative potential is given.

In addition, in the disclosure of Japanese Patent Application Laid-Open Publication No. 2002-270576 (Patent Document 3), a power output of a monopole chuck electrode is stopped to give no electric potential to the wafer while the plasma processing is not performed, thereby preventing foreign substances from being attracted to the wafer.

SUMMARY OF THE INVENTION

In the technologies of the Patent Document 1 and the Patent Document 2, a situation where most foreign substances are charged positively or negatively is assumed. Therefore, when both of positive and negative foreign substances exist in the processing chamber, an effect of reducing foreign substances adhering to the wafer cannot be expected.

In addition, in the technology of the Patent Document 3, no consideration is given to an electric potential of an inner wall surface of the processing chamber which is a source of foreign substances. Since an inner wall surface of a processing chamber in which plasma processing is performed is to be exposed to plasma, it is charged by the inflow of charged particles from the plasma and has an electric potential in some cases. When the inner wall surface of the processing chamber has an electric potential, since an electric potential difference occurs between the wafer and the inner wall surface, charged foreign substances may be attracted to the wafer.

In addition, factors by which an unintended electric potential difference occurs between the wafer and the inner wall surface of the processing chamber include a structure and aged deterioration of an electrostatic chuck electrode which is an electrode for chucking the wafer onto amounting stage. With respect to adhesion of foreign substances to the wafer by the Coulomb force, an operation and others of the electrostatic chucking electrode have a lot of influence.

An object of the present invention is to provide a technology capable of suppressing the occurrence of an unintended electric potential difference between a wafer and an inner wall surface of a processing chamber and reducing adhesion of charged foreign substances to the wafer during interruption of plasma discharge accompanying change of processing and conditions with respect to the plasma processing.

A typical embodiment of the present invention is a plasma processing apparatus, and it is characterized by having a configuration described below.

A plasma processing apparatus of one embodiment includes: a plasma processing chamber in which plasma processing of a sample is carried out by using plasma; a radio frequency power source which supplies a radio frequency power for generating the plasma; a sample stage which is disposed in the plasma processing chamber and on which the sample is mounted; an electrode which is arranged inside the sample stage and electrostatically chucks the sample; a DC power source which applies a DC voltage to the electrode; and a control device which controls the DC power source so that a value calculated as a value of the DC voltage for reducing an electric potential difference between an electric potential of the sample and an electric potential of an inner wall of the plasma processing chamber in a case where the plasma does not exist is applied to the electrode.

A plasma processing apparatus of one embodiment includes: a plasma processing chamber in which plasma processing of a sample is carried out by using plasma; a radio frequency power source which supplies a radio frequency power for generating the plasma; a sample stage which is disposed in the plasma processing chamber and on which the sample is mounted; an electrode which is arranged inside the sample stage and electrostatically chucks the sample; a DC power source which applies a DC voltage to the electrode; and a control device which controls the DC power source so that a value calculated as a value of the DC voltage for reducing an electric potential of the sample in a case where the plasma does not exist and an electric potential of an inner wall of the plasma processing chamber is approximately 0 V is applied to the electrode.

In the plasma processing apparatus of one embodiment, the electrode is provided with a first electrode to which a positive DC voltage is applied and a second electrode to which a negative DC voltage is applied, and the DC power source is provided with a first DC power source which applies a DC voltage to the first electrode and a second DC power source which applies a DC voltage to the second electrode.

In the plasma processing apparatus of one embodiment, the predetermined range of the difference between wafer potential and inner wall potential is ±10 V.

According to the typical embodiment of the present invention, it is possible to suppress the occurrence of an unintended electric potential difference between a wafer and an inner wall surface of a processing chamber and reduce adhesion of charged foreign substances to the wafer during interruption of plasma discharge accompanying change of processing with respect to the plasma processing.

BRIEF DESCRIPTIONS OF THE DRAWINGS

FIG. 11 a time chart illustrating a state of processing in the plasma processing apparatus of the fourth embodiment.

DESCRIPTIONS OF THE PREFERRED EMBODIMENTS

Figure 1:
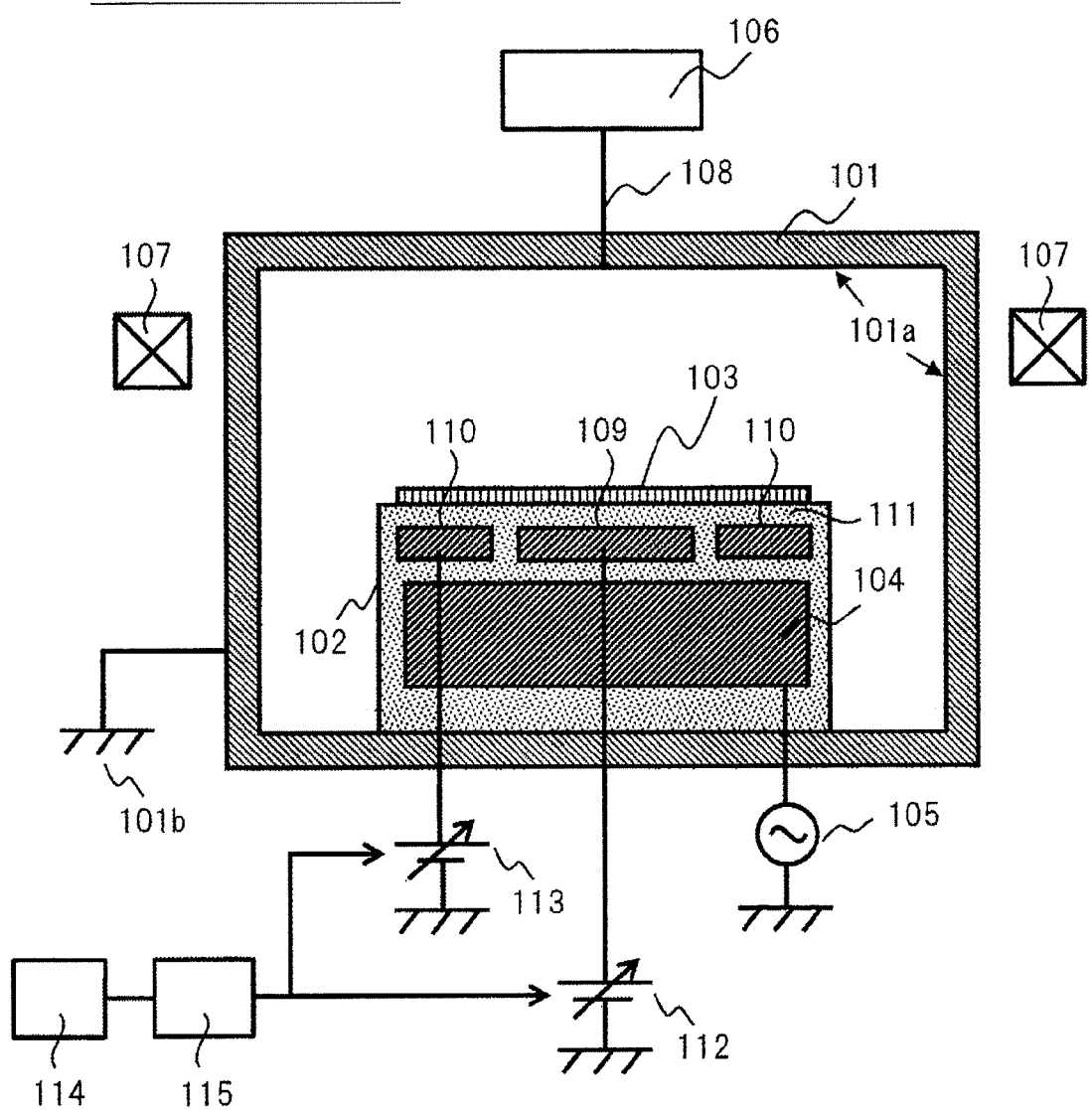
FIG. 1 is a diagram illustrating a cross-sectional configuration of a main part of a plasma processing apparatus of the first embodiment of the present invention.

Hereinafter, embodiments of the present invention will be described in detail based on drawings. Note that components having the same function are denoted by the same reference characters throughout the drawings for describing the embodiments, and the repetitive description thereof will be omitted. In addition, although both of "discharging" and "plasma" are used in the descriptions of respective embodiments, "discharging" and "plasma" are used as a synonym.

Outline

Outline of the embodiments will be described while giving supplementary descriptions about the background art and problems. Conventionally, at the time of changing plasma processing and conditions thereof, it takes a time, for example, from several seconds to ten-odd seconds. In the case of changing the gas to be used, time for exhausting the gas used in previous processing from a processing chamber and filling the processing chamber with gas used in subsequent processing is needed.

An electrostatic chuck electrode and a wafer in a processing chamber are electrically connected by a dielectric layer interposed therebetween with a finite resistance value and electrostatic capacitance value. The electrostatic chuck electrode fixes a wafer on the stage with the Coulomb force. As for the electrostatic chuck electrode, there exist a monopole type and a multipole type. Among multipole types, one having two sheets of electrodes is described as a bipolar type in particular.

In the monopole electrode, an electric potential given to the electrode influences an electric potential of the wafer. In the case of the monopole electrode, for example, when a positive potential is given to chuck a wafer, a positive potential appears in the wafer if plasma discharge is not performed.

On the other hand, in the case of the bipolar electrode, electric potentials having opposite polarities are given to respective electrodes to chuck a wafer. At this time, an electric potential of the wafer is designed ideally so as to be an average value of the electric potentials given to both electrodes in many cases. For example, when an electric potential of +500 V is given to one electrode and an electric potential of −500 V is given to the other electrode, an electric potential of the wafer becomes 0 V. When an electric potential of +600 V is given to one electrode and an electric potential of −400 V is given to the other electrode, an electric potential of the wafer becomes +100 V.

Factors by which an unintended electric potential difference occurs between a wafer and an inner wall surface of a processing chamber include a structural problem and an aged deterioration of an electrostatic chuck electrode. For example, in the case of the chucking with the bipolar electrode, a difference in resistance value occurs between each of the two electrodes and the wafer in some cases when the two electrodes have different areas or foreign substances or the like adhere to amounting stage of the wafer. In these cases, even if the average value of the electric potentials given to the two electrostatic chuck electrodes is made to be 0 V, an electric potential may occur on the wafer due to a ununiformity of the electrode state thereof.

Due to the influences including the above-mentioned electrostatic chuck electrode, an electric potential difference equal to or larger than a certain extent occurs between the wafer and the inner wall surface of the processing chamber during interruption of the plasma discharge. Thus, charged foreign substances in the processing chamber are sometimes attracted and adhere to the wafer by the Coulomb force.

A plasma processing apparatus of an embodiment of the present invention has a mechanism which suppresses the occurrence of an unintended electric potential difference between a wafer and an inner wall surface of a processing chamber due to influences including the above-mentioned electrostatic chuck electrode during interruption of the plasma discharge accompanying change of the plasma processing and conditions thereof. Thus, the adhesion of charged foreign substances in the processing chamber attracted by the Coulomb force to the wafer is reduced.

First Embodiment

A plasma processing apparatus of the first embodiment of the present invention will be described with reference to FIGS. 1 to 5.

[Plasma Processing Apparatus]

FIG. 1 illustrates a cross-sectional configuration of a main part of the plasma processing apparatus of the first embodiment. The plasma processing apparatus of the first embodiment of FIG. 1 is an electron cyclotron resonance etching apparatus. Hereinafter, the electron cyclotron resonance is described as ECR. The plasma processing apparatus according to the present invention is applicable without being limited to an ECR etching apparatus.

In the plasma processing apparatus which is the ECR etching apparatus of FIG. 1, a wafer 103 that is a semiconductor substrate to be a sample is mounted on a mounting stage 102 that is a sample stage inside a processing chamber 101 serving as a vacuum processing chamber, and plasma is generated in the processing chamber 101.

After generating plasma, the plasma processing apparatus supplies an electric power from a radio frequency power source 105 to a radio frequency electrode 104 provided in the mounting stage 102. By supplying this electric power, a negative potential referred to as a self-bias is generated in the wafer 103. By drawing ions into the wafer 103 with this negative potential, so-called reactive ion etching occurs, and an etching process proceeds.

An inner wall base material of the processing chamber 101 contains a grounded conductor. In the first embodiment, a conductor inner wall base material that is the inner wall base material containing grounded conductor mentioned above may be exposed to the plasma. In addition, this conductor inner wall base material may have a thin dielectric film which makes the inner wall surface have approximately 0 V promptly after the plasma disappears. 101a denotes the inner wall surface of the processing chamber 101 and the conductor inner wall base material mentioned above. 101b denotes grounding with respect to the inner wall surface 101a.

The plasma processing apparatus is provided with a microwave oscillation source 106 and a solenoid coil 107 as a mechanism for generating plasma. A microwave generated in the microwave oscillation source 106 is introduced into the processing chamber 101 via a waveguide 108. The microwave gives energy to electrons by ECR in a magnetic field generated by the solenoid coil 107. The electrons ionize the gas supplied from a gas supply source (not shown), thereby generating the plasma.

During the plasma processing described above, a coolant gas for adjusting a temperature of the wafer 103 is supplied to a rear surface of the wafer 103. For the purpose of preventing the wafer 103 from moving due to the coolant gas, the wafer 103 is chucked on the mounting stage 102 by bipolar electrostatic chuck electrodes 109 and 110. The electrostatic chuck electrodes 109 and 110 are arranged in a concentric pattern with the electrostatic chuck electrode 109 serving as one electrode on the inside and the electrostatic chuck electrode 110 serving as the other electrode on the outside. A dielectric layer 111 is present between the electrostatic chuck electrodes 109 and 110 and the wafer 103. The electrostatic chuck electrodes 109 and 110 and the wafer 103 are electrically connected with a finite resistance value and electrostatic capacitance.

Variable DC power sources 112 and 113 that are independent DC power sources are connected to the electrostatic chuck electrodes 109 and 110, respectively. One variable DC power source 112 is connected to the electrostatic chuck electrode 109 on the inside, and the other variable DC power source 113 is connected to the electrostatic chuck electrode 110 on the outside. Electric potentials having opposite polarities are given from the respective power sources to the electrostatic chuck electrodes 109 and 110. For example, an electric potential of +500 V is given to the electrostatic chuck electrode 109 on the inside from the variable DC power source 112, and an electric potential of −500 V is given to the electrostatic chuck electrode 110 on the outside from the variable DC power source 113.

In addition, the plasma processing apparatus of the first embodiment is provided with a control device 115 and a storage device 114 for controlling an output voltage value of the variable DC power sources 112 and 113 mentioned above. The variable DC power sources 112 and 113 are connected to the control device 115 and the output voltage values thereof are controlled from the control device 115.

In the first embodiment, the dielectric layer 111 between the electrostatic chuck electrodes 109 and 110 and the wafer 103 has a resistivity with which a certain amount of leakage current may flow. For example, when the dielectric layer 111 is a sprayed film for chucking a wafer based on a Johnsen-Rahbek effect, a leakage current as mentioned above flows. Note that the Johnsen-Rahbek effect is a phenomenon in which an attraction force is generated by giving an electric potential difference between a metal surface and a semiconductor surface, and is often used as one method of electrostatic chucking.

[Equivalent Circuit]

Figure 2:
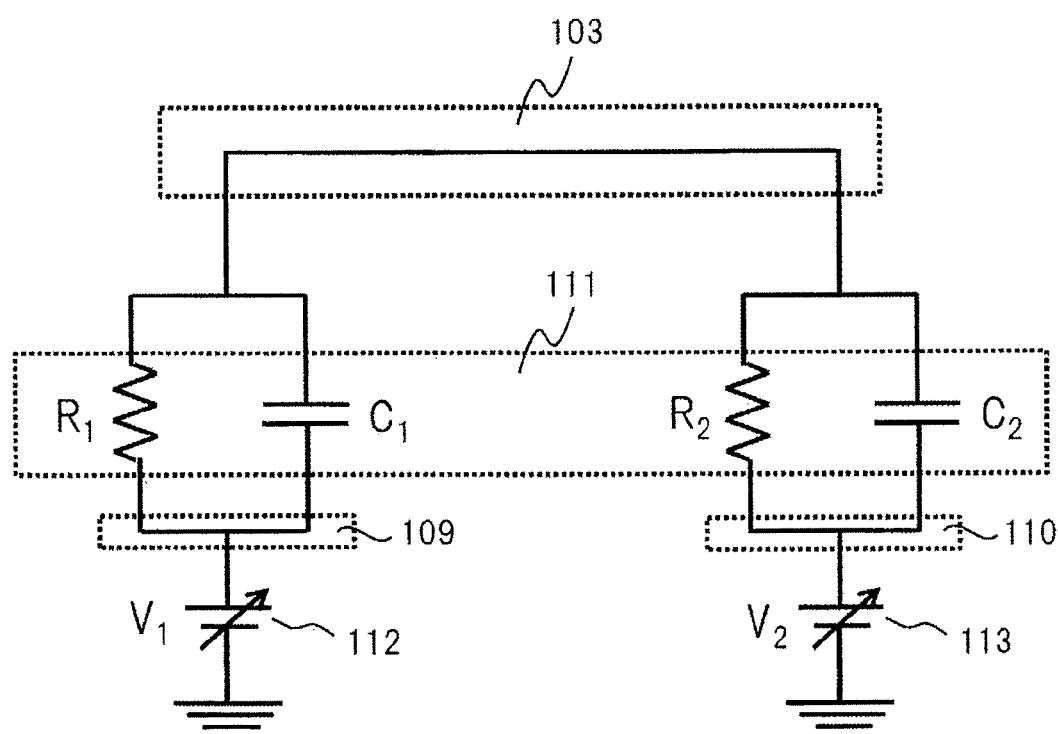
FIG. 2 is a diagram illustrating an equivalent circuit in which a variable DC power source, electrostatic chuck electrodes, a dielectric layer and a wafer in the first embodiment are modeled.

FIG. 2 illustrates an equivalent circuit in which the variable DC power sources 112 and 113, the electrostatic chuck electrodes 109 and 110, the dielectric layer 111 and the wafer 103 in the plasma processing apparatus of the first embodiment are simply modeled. Note that a resistance of the wafer 103 is assumed to be so small as to be ignored in this equivalent circuit. In the equivalent circuit of FIG. 2, $V_1$ denotes a voltage of the variable DC power source 112, and $V_2$ denotes a voltage of the variable DC power source 113. $R_1$ and $R_2$ denote a resistance of the dielectric layer 111, and $C_1$ and $C_2$ denote a capacitance of the dielectric layer 111. $R_1$ and $C_1$ denote a resistance and a capacitance of one electrostatic chuck electrode 109, and $R_2$ and $C_2$ denote a resistance and a capacitance of the other electrostatic chuck electrode 110.

$V_{waf}$ that is an electric potential of the wafer 103 in a steady state in which the plasma discharge is not performed is represented by the following expression 1. In the expression 1, $R_1$ and $R_2$ denote resistance values of the resistance of the dielectric layer 111 mentioned above, and $V_1$ and $V_2$ denote output voltage values of the variable DC power source 112 and 113 mentioned above.

[Expression 1]

$$V_{waf} = \frac{V_1 R_2 + V_2 R_1}{R_1 + R_2} \qquad \text{Expression 1}$$

Therefore, in the case of $R_1=R_2$ in the expression 1, an electric potential of the wafer 103 is an average value of $V_1$ and $V_2$ that are output voltage values of the variable DC power sources 112 and 113.

Meanwhile, when resistance values are changed for a certain reason and $R_1$ and $R_2$ are not equal in the expression 1, the electric potential of the wafer 103 does not become an average value of output voltage values of both power sources, and an unintended electric potential is given to the wafer 103. When an unintended electric potential is given to the wafer 103, there is a possibility that charged foreign substances may be attracted to the wafer due to an electric potential difference between the wafer 103 and the inner wall surface 101a of the processing chamber 101. The inner wall surface 101a of the processing chamber 101 is one of generation sources of the foreign substances.

In order to prevent an unintended electric potential from occurring in the wafer 103, the plasma processing apparatus of the first embodiment controls $V_1$ and $V_2$ that are output voltage values of the variable DC power sources 112 and 113 in accordance with the resistance values $R_1$ and $R_2$ mentioned above so that an electric potential given to the wafer 103 may have a desired value.

In the first embodiment, it is assumed that the base material of the inner wall surface 101a of the processing chamber 101 is a grounded conductor and the grounding resistance value and earth electrostatic capacitance of a surface thereof are sufficiently small. Therefore, an electric potential of the inner wall surface 101a of the processing chamber 101 during interruption of the plasma discharge becomes approximately 0 V comparatively promptly after the end of discharging. For this reason, if an electric potential of the wafer 103 is made to be approximately 0 V, it is possible to prevent an electric potential difference from occurring between the wafer 103 and the inner wall surface 101a of the processing chamber 101.

An output voltage ratio between the variable DC power source 112 and the variable DC power source 113 at which an electric potential of the wafer 103 becomes 0 V is given by the following expression 2 from the expression 1.

[Expression 2]

$$\frac{V_2}{V_1} = -\frac{R_2}{R_1} \qquad \text{Expression 2}$$

The plasma processing apparatus of the first embodiment changes $V_1$ and $V_2$ that are output voltages of the variable DC power sources 112 and 113 connected to the electrostatic chuck electrodes 109 and 110 so as to satisfy the above-mentioned expression 2 during interruption of the plasma discharge accompanying the change of the plasma processing and conditions thereof. In this manner, the plasma processing apparatus of the first embodiment sets the electric potential of the wafer 103 to 0 V to prevent the occurrence of an electric potential difference between the wafer 103 and the inner wall surface 101a of the processing chamber 101.

[Processing Time Chart]

Figure 3:
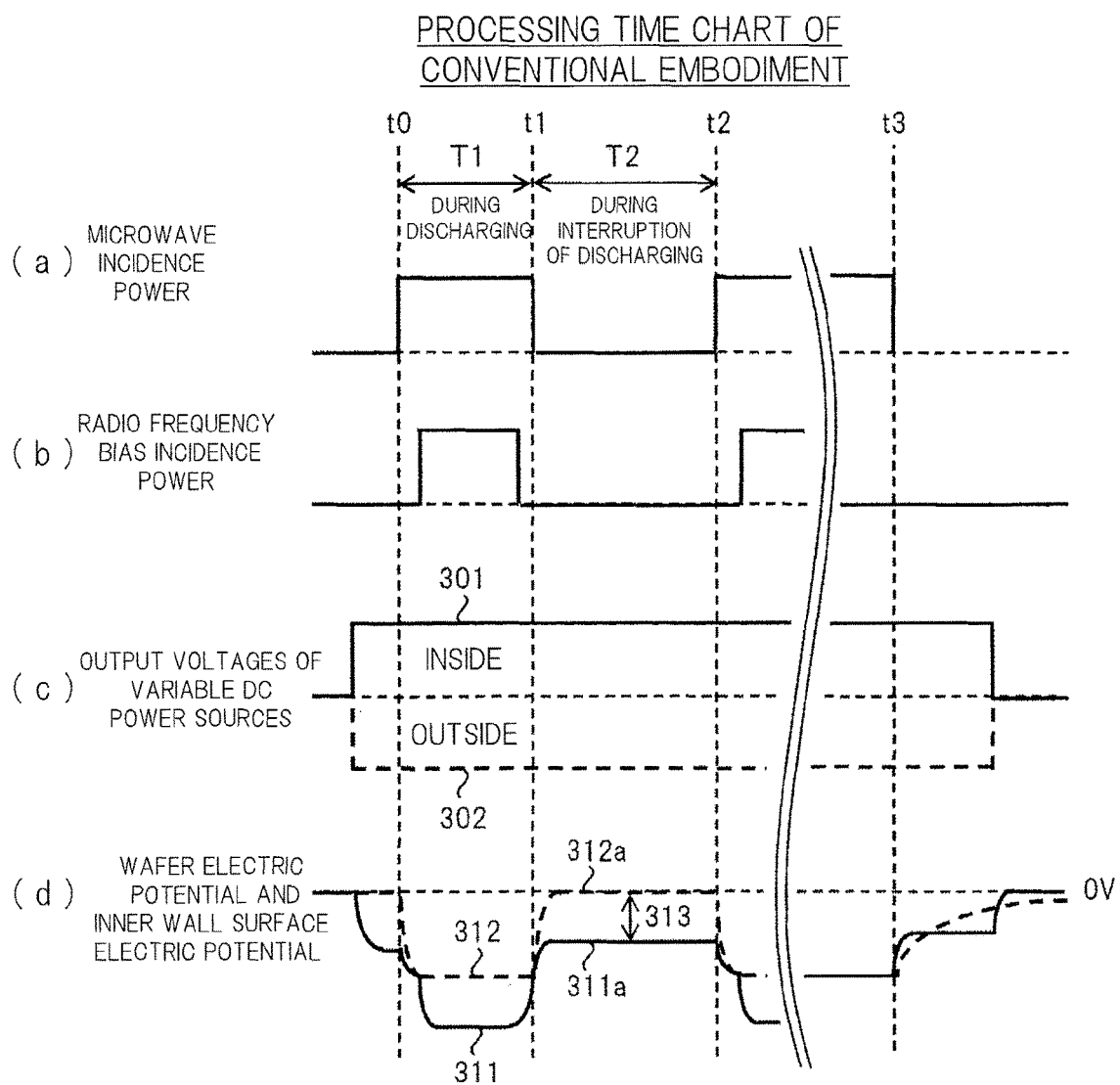
FIG. 3 is a time chart illustrating a state of processing in a plasma processing apparatus of conventional embodiment.

FIG. 3 is a time chart illustrating a state of a conventional processing including plasma processing in a plasma processing apparatus. This plasma processing apparatus has a configuration of the processing chamber 101 similar to that of FIG. 1, but it does not have the mechanism to control the output voltages to the electrostatic chuck electrodes 109 and 110 during interruption of the plasma discharge by the control device 115 of the first embodiment.

In FIG. 3, (a) illustrates a microwave incidence power, and it is a microwave electric power from the microwave oscillation source 106. Also, (b) illustrates a radio frequency bias incidence power, and it is an electric power to the radio frequency electrode 104 from the radio frequency power source 105. Further, (c) illustrates output voltages of variable DC power sources. A solid line 301 indicates an output voltage of the variable DC power source 112 to the electrostatic chuck electrode 109 on the inside, and a dashed line 302 indicates an output voltage of the variable DC power source 113 to the electrostatic chuck electrode 110 on the outside. In this embodiment, the output voltages are constant without variable control being carried out. In addition, (d) illustrates a wafer electric potential and an inner wall surface electric potential. A solid line 311 indicates an electric potential of the wafer 103, and a dashed line 312 indicates an electric potential of the inner wall surface 101a of the processing chamber 101. A time period T1 from a time t0 to a time t1 indicates the time period during plasma discharge. A time period T2 from a time t1 to a time t2 indicates the time period during interruption of the plasma discharge.

In the case of processing in the conventional embodiment of FIG. 3, an electric potential difference as indicated by 313 occurs between a wafer electric potential 311a and an inner wall surface electric potential 312a in the time period T2 during interruption of discharging of (d). There is a possibility that foreign substances are attracted and adhere to the wafer 103 due to the electric potential difference.

Figure 4:
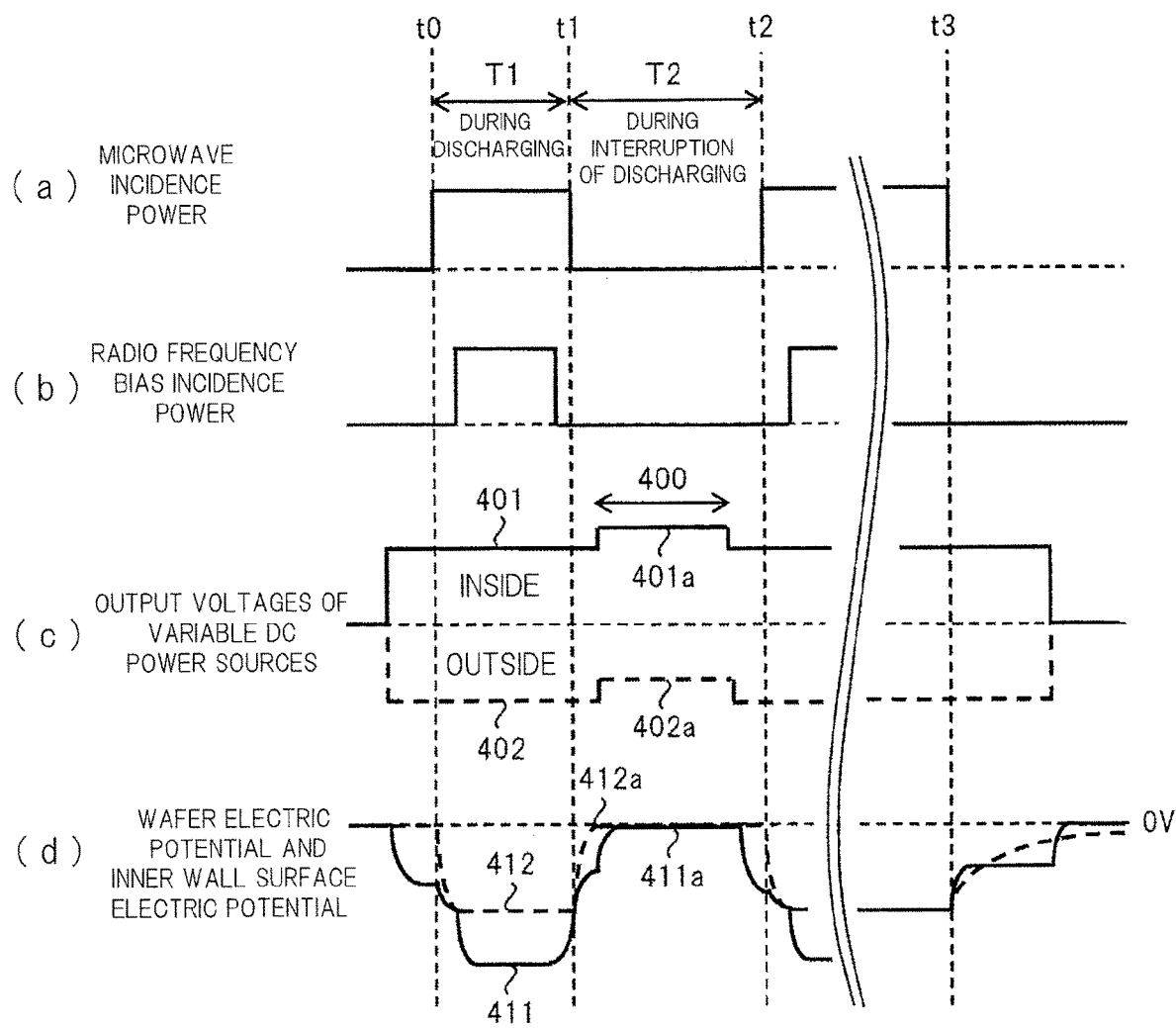
FIG. 4 is a time chart illustrating a state of processing in a plasma processing apparatus of the first embodiment, the second embodiment and the third embodiment.

FIG. 4 is a time chart illustrating a state of processing including the plasma processing in the plasma processing apparatus of the first embodiment in the same way as FIG. 3. In FIG. 4, (a) illustrates a microwave incidence power, and it is a microwave electric power from the microwave oscillation source 106. Also, (b) illustrates a radio frequency bias incidence power, and it is an electric power to the radio frequency electrode 104 from the radio frequency power source 105. Further, (c) illustrates output voltages of variable DC power sources. A solid line 401 indicates an output voltage of the variable DC power source 112 to the electrostatic chuck electrode 109 on the inside, and a dashed line 402 indicates an output voltage of the variable DC power source 113 to the electrostatic chuck electrode 110 on the outside. In the first embodiment, the output voltages are controlled variably. In addition, (d) illustrates a wafer electric potential and an inner wall surface electric potential. A solid line 411 indicates an electric potential of the wafer 103, and a dashed line 412 indicates an electric potential of the inner wall surface 101a of the processing chamber 101.

In the plasma processing apparatus of the first embodiment, after the wafer 103 is mounted on the mounting stage 102 serving as a sample stage, the variable DC power source 112 and the variable DC power source 113 output predetermined voltages for chucking the wafer 103 based on the control from the control device 115. The plasma processing apparatus then prepares for processing such as pressure adjustment in the processing chamber 101. Illustration with respect to this preparation is omitted.

After the above-mentioned preparation is completed, a predetermined microwave electric power for generating plasma is applied from a time t0 as illustrated in (a) of FIG. 4. After the plasma is thus generated, a radio frequency bias is applied as illustrated in (b) of FIG. 4 in a time period T1 during discharging, and an etching process is performed. When the desired etching process is completed, the radio frequency bias incidence power is first cut off in (b) of FIG. 4. By cutting off the radio frequency bias incidence power, an electric potential 411 of the wafer 103 and an electric potential 412 of the inner wall surface 101a become almost equal as indicated at a time t1 in (d) of FIG. 4.

Subsequently, in a time period T2 during interruption of discharging in (a) of FIG. 4, supply of the microwave incidence power is stopped, and plasma discharge is interrupted for the preparation of the subsequent processing.

At a moment of the end of plasma discharge indicated by the time t1, the inner wall surface 101a of the processing chamber 101 is charged by electron inflow from the plasma, and has a certain level of electric potential as illustrated by the potential 412 in (d) of FIG. 4. This electric potential changes in accordance with a time constant with which a charge accumulated in the inner wall surface 101a of the processing chamber 101 is released to the earth. In the first embodiment, it is assumed that this time constant is short and the electric potential of the inner wall surface 101a of the processing chamber 101 comes to be 0 V comparatively promptly as illustrated by 412a.

In addition, also with respect to the electric potential of the wafer 103, the electric potential generated by charging due to the inflow of charged particles from the plasma disappears comparatively quickly at the time t1 because a certain level of leakage current flows, and the electric potential of the wafer 103 becomes an electric potential in accordance with characteristics of respective electrodes, which is determined by the inside and outside difference of the resistance value or the like.

Therefore, for example, when $R_1$ and $R_2$ mentioned above are not equal, in the case of the processing of the plasma processing apparatus of the one embodiment of FIG. 3, the electric potential of the inner wall surface 101a becomes 0 V as indicated by 312a in the time period T2 during interruption of discharging as illustrated by (d) of FIG. 3, but the electric potential of the wafer 103 does not become 0 V as indicated by 311a. More specifically, an electric potential difference indicated by 313 occurs between the wafer 103 and the inner wall surface 101a.

Meanwhile, in the processing of the plasma processing apparatus of the first embodiment of FIG. 4, the variable control of the output voltages of the variable DC power source 112 and the variable DC power source 113 in (c) of FIG. 4 is carried out by the control device 115. 400 in (c) of FIG. 4 denotes a change and a time period thereof of the output voltages of the variable DC power source 112 and the variable DC power source 113.

The control device 115 changes the electric potential of the wafer 103 as illustrated by (d) of FIG. 4 by the control of the output voltage illustrated by (c) of FIG. 4. More specifically, the control device 115 changes the output voltage so as to satisfy the expression 2 so that the electric potential 411 of the wafer 103 in the time period T1 during discharging in (d) of FIG. 4 becomes 0 V as indicated by 411a in the time period T2 during interruption of discharging.

In the time period T1 during discharging in (c) of FIG. 4, the output voltage 401 of the variable DC power source 112 is a predetermined positive voltage, and the output voltage 402 of the variable DC power source 113 is a predetermined negative voltage. The control device 115 carries out the control of maintaining each predetermined output voltage value in the time period 400 within the time period T2 during interruption of discharging. More specifically, the control device 115 changes the output voltage 401 of the variable DC power source 112 so as to be higher by a predetermined voltage in the time period 400, and maintains a state of the voltage indicated by 401a. Similarly, the control device 115 changes the output voltage 402 of the variable DC power source 113 so as to be higher by a predetermined voltage in the time period 400, and maintains a state of the voltage indicated by 402a. In this manner, in the time period 400, the electric potential 411a of the wafer 103 comes close to 0 V like the electric potential 412a of the inner wall surface 101a in (d) of FIG. 4.

In the plasma processing apparatus of the first embodiment, the change of the output voltage values of the variable DC power sources 112 and 113 to the electrostatic chuck electrodes 109 and 110 mentioned above is achieved in the following manner. That is, the storage device 114 stores the output voltage values of the variable DC power sources 112 and 113 to be output in the time period T2 during interruption of the plasma discharge. The control device 115 variably controls the output voltage values of the variable DC power sources 112 and 113 so as to become the output voltage values stored in the storage device 114 in the time period T2 during interruption of discharging.

Note that the plasma processing apparatus may be provided with a user interface for setting the output voltage values of the above-mentioned control in the storage device 114 based on an operation by a user.

The plasma processing apparatus of the first embodiment eliminates the electric potential difference between the wafer 103 and the inner wall surface 101a in the time period T2 during interruption of discharging by the operations including the control mentioned above. In the time period 400, the electric potential difference becomes approximately 0 V as indicated by 411a and 412a in (d) of FIG. 4. In this manner, foreign substances are prevented from being attracted and adhering to the wafer 103.

The plasma processing apparatus prepares for a subsequent discharging process such as pressure adjustment in the processing chamber 101 while maintaining the predetermined output voltage in the time period 400 within the time period T2 by the control of the control device 115 mentioned above. After the end of the preparation, the plasma processing apparatus stops the control in the time period 400 by the control device 115. Thus, the variable DC power sources 112 and 113 output predetermined voltages for the subsequent discharging process, that is, the same voltages as 401 and 402. Thereafter, supply of the microwave incidence power is started from the time t2, and the subsequent discharging process is carried out.

The plasma processing apparatus repeats the control including the plasma discharge process and the interruption of discharging as mentioned above until the final discharging process is completed, and after the end of the final discharging process, the plasma processing apparatus cuts off the voltages of the variable DC power sources 112 and 113 through a predetermined wafer discharging sequence.

[Effects Etc.]

In eliminating an electric potential difference between the wafer 103 and the inner wall surface 101a of the processing chamber 101 during interruption of the plasma discharge mentioned above, examination was carried out as follows as to what extent the electric potential difference is reduced for sufficiently acquiring the effect of reducing the adhesion of foreign substances.

Figure 5:
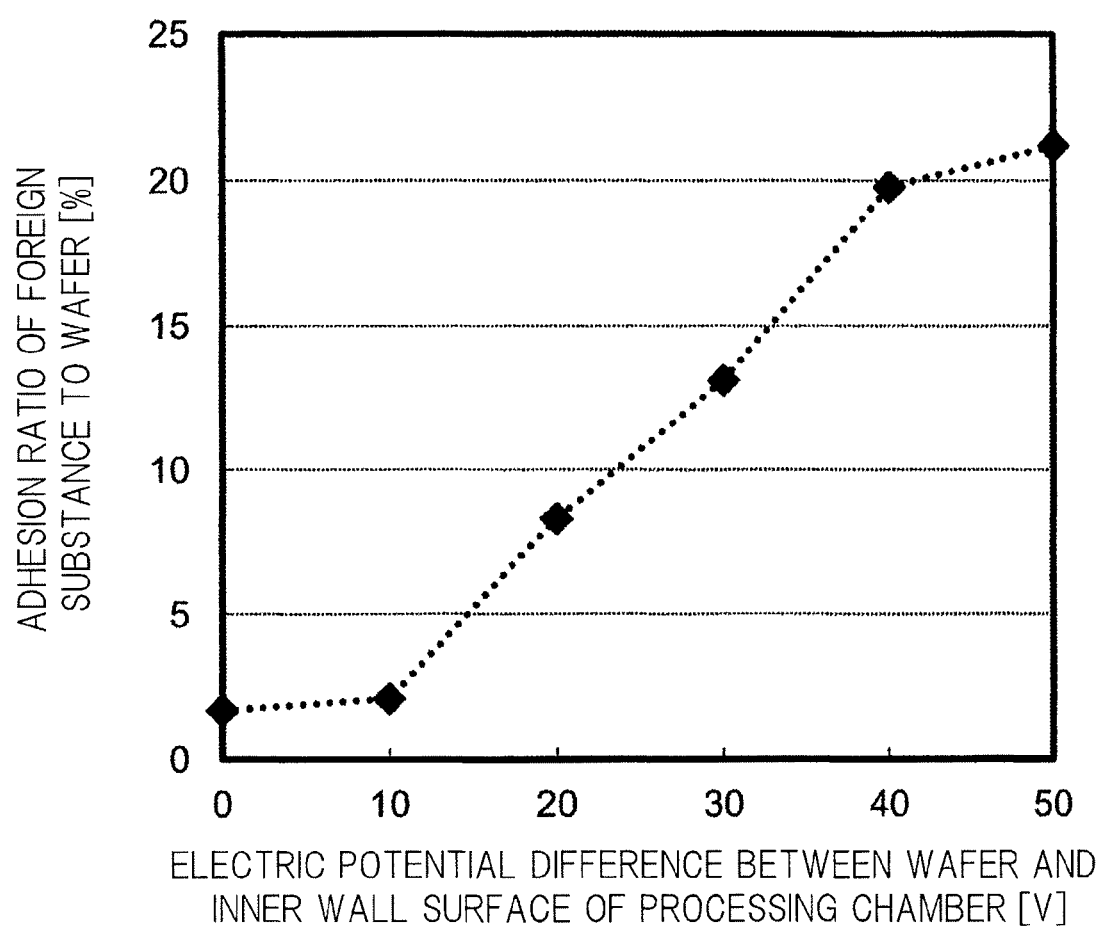
FIG. 5 is a graph illustrating a calculation result of an estimation with respect to an effect of reducing adhesion of foreign substances to a wafer in the plasma processing apparatus of the first embodiment.

FIG. 5 is a graph illustrating a result of numerical estimation with respect to the effect of reducing the adhesion of charged foreign substances to the wafer 103 in the plasma processing apparatus of the first embodiment. The horizontal axis of the graph represents an electric potential difference [V] between the wafer 103 and the inner wall surface 101a of the processing chamber 101. The vertical axis of the graph represents an adhesion ratio [%] of foreign substances to the wafer 103.

The calculation was performed under the following conditions. That is, a pressure in the processing chamber 101 was set to 0.6 Pa, and a gas flow having an average of about 3 m/s toward an exhaust port existed in the processing chamber 101. 1000 pieces of foreign substances are generated from a side surface of the inner wall surfaces 101a of the vacuum processing chamber 101. Generation positions of the foreign substances were specified as a rough area, and each of the generation locations of 1000 pieces of foreign substances was determined at random within the specified area. As for a particle diameter of the foreign substance, a value of 15 nm or more and 120 nm or less was given at random to each of 1000 pieces of the foreign substances. Also with respect to an initial velocity of the foreign substances, a value of 5 m/s or less was given at random to each of 1000 pieces of foreign substances. In this calculation, in order to estimate the effect of attracting the charged foreign substances to the wafer 103, the charge of foreign substances was set to $-1.6 \times 10^{-19}$ [C] in all of the 1000 pieces of foreign substances.

An adhesion ratio of foreign substances to the wafer 103 was calculated under the above-mentioned conditions. As the result, as illustrated in FIG. 5, when an electric potential difference between the wafer 103 and the inner wall surface 101a of the processing chamber 101 was +10 V, foreign substances adhering to the wafer 103 were approximately 2%. This adhesion ratio was almost equal to the adhesion ratio in the case where an electric potential difference was 0 V. However, according to the result of estimation, when an electric potential difference between the wafer 103 and the inner wall surface 101a of the processing chamber 101 was +20 V, the adhesion ratio increased to approximately 8%.

From the result mentioned above, in the plasma processing apparatus of the first embodiment, a standard of the electric potential difference between the wafer 103 and the inner wall surface 101a during interruption of the plasma discharge capable of sufficiently acquiring the effect of reducing adhesion of foreign substances was set to within ±10 V. Although an electric potential difference in the time period T2 during interruption of discharging is indicated as 0 V in (d) of FIG. 4, a properly sufficient effect can be acquired if this electric potential difference is within ±10 V. 071 As mentioned above, according to the plasma processing apparatus and the plasma processing method of the first embodiment, it is possible to suppress the occurrence of an unintended electric potential difference between the wafer 103 and the inner wall surface 101a of the processing chamber 101 during the plasma processing and interruption of the plasma discharge accompanying the change of conditions, and to reduce the adhesion of charged foreign substances to the wafer 103.

Second Embodiment

A plasma processing apparatus of the second embodiment of the present invention will be described with reference to FIGS. 6 and 7. Hereinafter, a part of the configuration of the second embodiment which is different from that of the first embodiment will be described. In the plasma processing apparatus of the second embodiment, output voltages of the variable DC power sources 112 and 113 during interruption of discharging in the plasma processing apparatus of the first embodiment shown in FIG. 1 are determined based on a measurement for grasping a relation between an electric potential of the wafer 103 and output voltages of the variable DC power sources 112 and 113.

In the above-mentioned first embodiment, the configuration in which the electric potential of the wafer 103 is determined based on the resistance value of the dielectric layer 111 between the wafer 103 and the electrostatic chuck electrodes 109 and 110 has been illustrated. However, in the case where it is not possible to accurately grasp this resistance value or an unintended electric potential occurs by the other factors, the configuration of the first embodiment cannot be applied.

In that case, it is effective to apply the configuration of the second embodiment. In the second embodiment, a relation between $V_{waf}$ that is an electric potential of the wafer 103 and $V_1$ and $V_2$ that are output voltage values of the variable DC power sources 112 and 113 is grasped in advance by measurement. Thus, it is possible to perform the control to reduce an electric potential difference between the wafer 103 and the inner wall surface 101a of the processing chamber 101 during interruption of the plasma discharge. Hereinafter, the operation including the grasping process based on the measurement mentioned above will be referred to as verification.

The plasma processing apparatus of the second embodiment is provided with a mechanism including an experimental device as means for performing the above-mentioned verification in addition to the same constituent elements as the plasma processing apparatus of the first embodiment. As for a plasma processing method in the plasma processing apparatus of the second embodiment, the above-mentioned verification is first performed in the configuration of the plasma processing apparatus similar to that of the first embodiment.

For example, the above-mentioned verification is realized by the following means and procedures. The plasma processing apparatus of the second embodiment is provided with a mechanism capable of measuring an electric potential of the wafer 103. This mechanism is realized by, for example, releasing the processing chamber 101 in the atmosphere and sticking a potential measurement probe on the wafer 103. The plasma processing apparatus of the second embodiment uses this measurement mechanism to measure the electric potential of the wafer 103 in the case where output voltages of the variable DC power sources 112 and 113 are variously changed by the control device 115.

[Verification]

Figure 6:
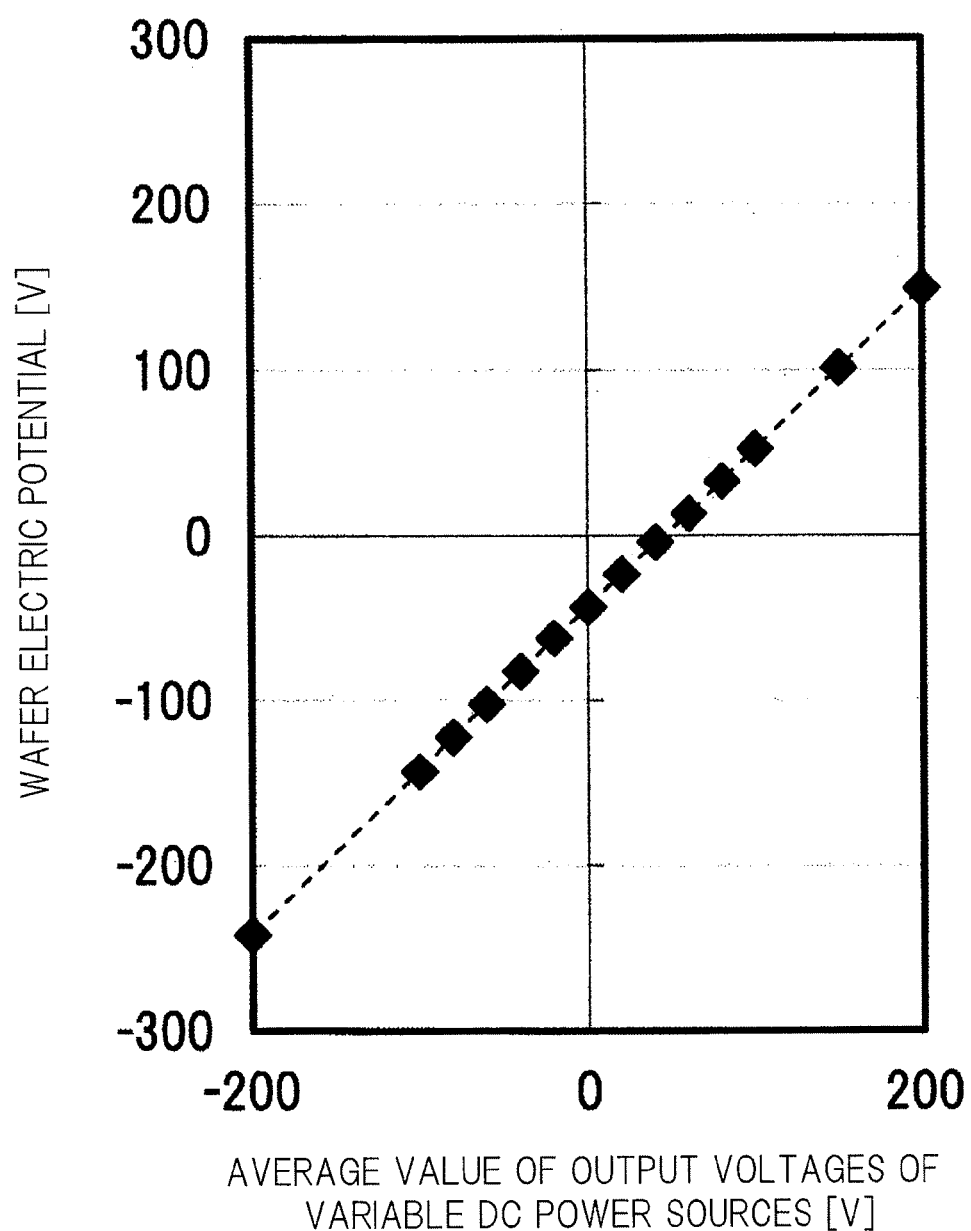
FIG. 6 is a graph illustrating a result of verification of a wafer electric potential with respect to output voltages of variable DC power sources in the plasma processing apparatus of the second embodiment.

FIG. 6 illustrates a graph showing the result of verification performed with respect to the electric potential of the wafer 103 and the output voltages of the variable DC power sources 112 and 113 by using the verification means including the above-mentioned experimental device and measurement mechanism in the plasma processing apparatus of the second embodiment. The horizontal axis of the graph represents an average value [V] of the output voltages of the variable DC power sources 112 and 113. The vertical axis of the graph represents the electric potential [V] of the wafer 103. In addition, this verification was performed in the state where the plasma is not generated.

In this verification, the following conditions were adopted. A reference output voltage of the variable DC power source 112 to the electrostatic chuck electrode 109 on the inside was +500 V, and a reference output voltage of the variable DC power source 113 to the electrostatic chuck electrode 110 on the outside was −500 V. These output voltages were changed by an equal amount in both of the variable DC power source 112 and the variable DC power source 113. For example, when an average value of output voltages of the variable DC power sources in the horizontal axis of FIG. 6 was changed by +10 V, both output voltages of the variable DC power source 112 and the variable DC power source 113 were changed by +10 V. In that case, the output voltage of the variable DC power source 112 was changed to +510 V, and the output voltage of the variable DC power source 113 was changed to −490 V.

As a result of the verification mentioned above, in the plasma processing apparatus of the second embodiment, an electric potential of about −40 V was given to the wafer 103 when an average value of the output voltages of the variable DC power sources 112 and 113 was 0 V as illustrated in FIG. 6. When the average value of output voltages was changed, the electric potential of the wafer 103 was also changed by substantially the same amount as the change amount of the average value. The average value of the output voltages at which the electric potential of the wafer 103 became 0 V was about +40 V.

In the plasma processing apparatus of the second embodiment, the electric potential of the inner wall surface 101a of the processing chamber 101 during interruption of the plasma discharge becomes approximately 0 V comparatively promptly after the end of discharging like the first embodiment. Therefore, the plasma processing apparatus of the second embodiment is configured so that an average value of the output voltages of the variable DC power sources 112 and 113 becomes +40 V during interruption of discharging by the control device 115. In this manner, as illustrated in (d) of FIG. 4, the electric potential difference between the wafer 103 and the inner wall surface 101a can be eliminated.

Output voltage values of the variable DC power sources 112 and 113 during interruption of the plasma discharge which are determined based on the above-mentioned verification are denoted as $V_{1ctrl}$ and $V_{2ctrl}$. 401a of FIG. 4 corresponds to $V_{1ctrl}$, and 402a of FIG. 4 corresponds to $V_{2ctrl}$. The storage device 114 stores the output voltage values $V_{1ctrl}$ and $V_{2ctrl}$. The plasma processing apparatus controls the output voltage values of the variable DC power sources 112 and 113 so as to be $V_{1ctrl}$ and $V_{2ctrl}$ by the control device 115 in the time period 400 within the time period T2 during interruption of the plasma discharge.

[Effects Etc.]

Figure 7:
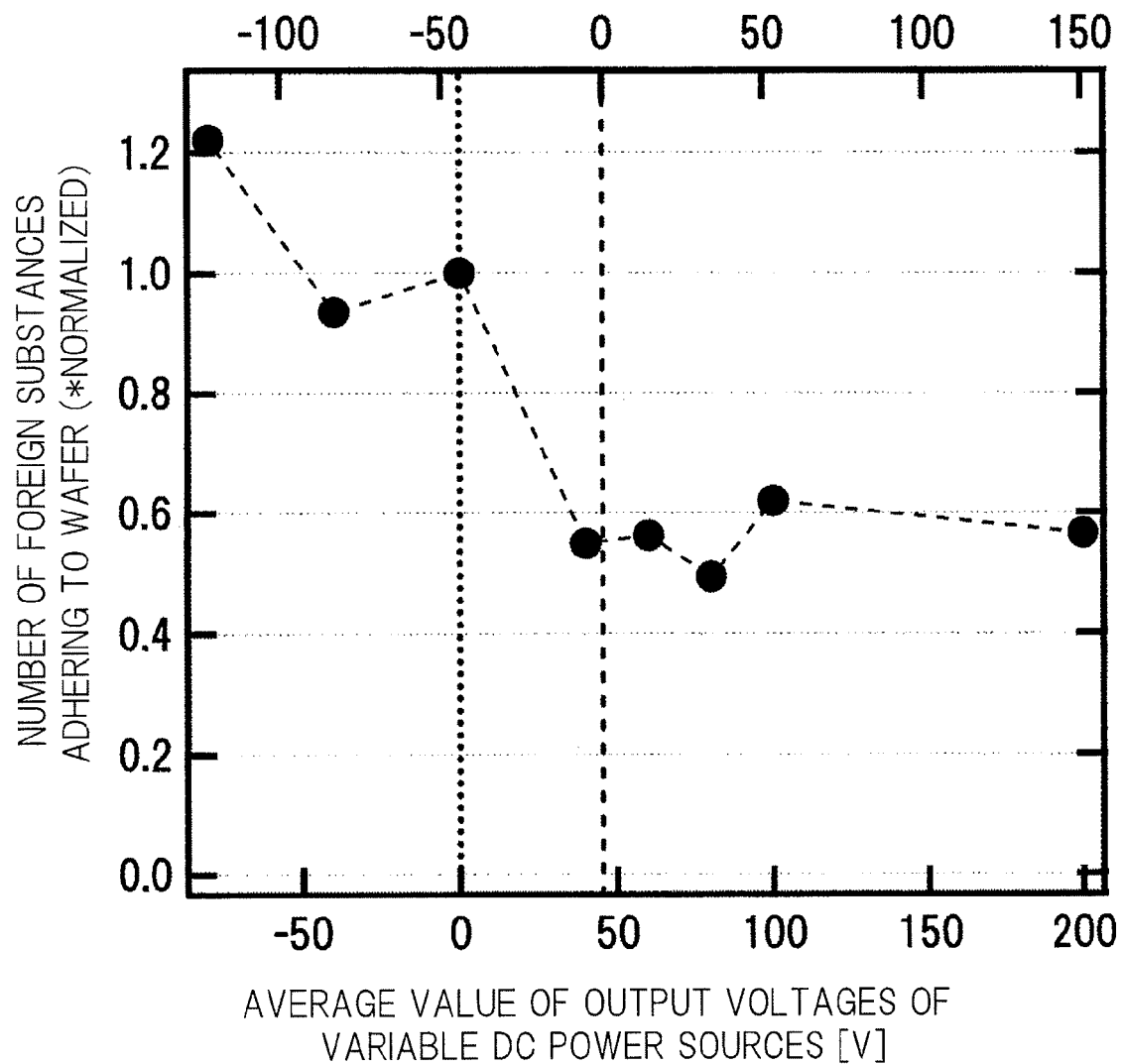
FIG. 7 is a graph illustrating a change of the number of foreign substances adhering to a wafer when output voltages of variable DC power sources are changed during interruption of discharging in the plasma processing apparatus of the second embodiment.

FIG. 7 is a graph illustrating a change of the number of foreign substances adhering to the wafer 103 in the case where output voltages of the variable DC power sources 112 and 113 are variously changed during interruption of discharging as an effect of reducing adhesion of foreign substances in the plasma processing apparatus of the second embodiment. The horizontal axis of the graph represents an average value [V] of the output voltages of the variable DC power sources 112 and 113 and the electric potential [V] of the wafer 103 associated therewith. The vertical axis of the graph represents the number of foreign substances adhering to the wafer 103. This number of foreign substances indicates a value normalized by the number of foreign substances in the case where an average value of the output voltages of the variable DC power sources 112 and 113 is 0 V.

As illustrated in FIG. 7, when an average value of the output voltages of the variable DC power sources 112 and 113 is close to +40 V, that is, the electric potential of the wafer 103 is close to 0 V, an effect of reducing foreign substances of approximately 40% can be acquired as compared with the case where an average value of the output voltages of the variable DC power sources 112 and 113 is 0 V, which is an normal operation in the prior art. In addition, when the electric potential of the wafer 103 has negative polarity, the larger an absolute value of the electric potential of the wafer 103 becomes, the larger the number of foreign substances adhering to the wafer 103 becomes. On the other hand, when the electric potential of the wafer 103 has positive polarity, the number of foreign substances adhering to the wafer 103 does not change greatly even if an absolute value of the electric potential of the wafer 103 becomes large.

The following two points are guessed from the above-mentioned result. One point is that most of charged foreign substances in the processing chamber 101 are charged in the positive polarity. The increase of adhering foreign substances in the case where the electric potential of the wafer 103 has the negative polarity is considered due to the result that foreign substances charged in the positive polarity are attracted to the wafer by the electric potential of the wafer 103.

Another point is that the effect of the method of reducing foreign substances by applying an electric potential having the same polarity as the charged foreign substances to the wafer 103 to bounce the charged foreign substances flying to the wafer 103 is small. This is determined from the fact that although existence of foreign substances charged in the positive polarity is suggested from the above-mentioned result, an effect of reducing the foreign substances cannot be acquired even if an electric potential having the positive polarity is given to the wafer 103. This can be explained by considering the situation where foreign substances generated during interruption of discharging from the inner wall surface 101a of the processing chamber 101 have a sufficiently small initial velocity and few foreign substances can fly up to the wafer 103 when there is no electric potential difference between the wafer 103 and the inner wall surface 101a. Therefore, it can be said that it is important to control the electric potential so that charged foreign substances are not attracted to the wafer 103 unnecessarily during interruption of discharging.

In the plasma processing apparatus of the second embodiment, considerations including the above-mentioned two points are given, and the output voltages of the variable DC power sources 112 and 113 are controlled by the control device 115 to control the electric potential of the wafer 103 so that charged foreign substances are not attracted to the wafer 103 unnecessarily during interruption of discharging.

From the above-mentioned result, according to the plasma processing apparatus of the second embodiment, it was confirmed that the adhesion of charged foreign substances to the wafer 103 could be reduced by suppressing the occurrence of an unintended electric potential difference between the wafer 103 and the inner wall surface 101a of the processing chamber 101 during interruption of discharging.

Third Embodiment

A plasma processing apparatus of the third embodiment of the present invention will be described with reference to FIGS. 8 and 9. Hereinafter, a part of the configuration of the third embodiment which is different from those of the first embodiment and the second embodiment will be described.

[Plasma Processing Apparatus]

Figure 8:
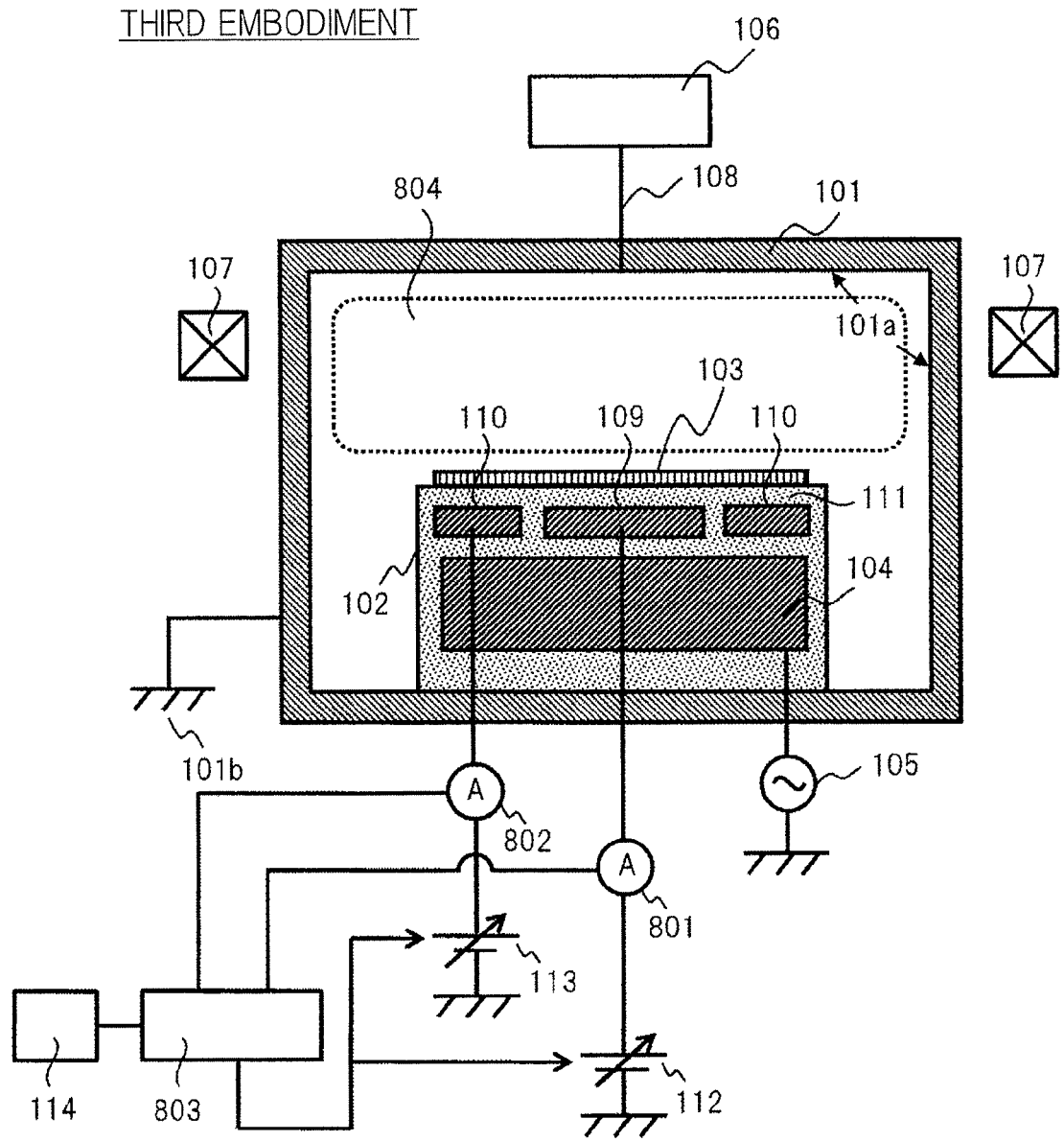
FIG. 8 is a diagram illustrating a cross-sectional configuration of a main part of the plasma processing apparatus of the third embodiment.

FIG. 8 illustrates a cross-sectional configuration of a main part of the plasma processing apparatus of the third embodiment. Although the plasma processing apparatus of the third embodiment of FIG. 8 is also an ECR etching apparatus, the plasma processing apparatus is applicable without being limited to the ECR etching apparatus. The plasma processing apparatus of the third embodiment is provided with verification means different from that of the second embodiment in addition to constituent elements of the plasma processing apparatus of the first embodiment and the second embodiment. The verification means in the third embodiment includes a mechanism for carrying out the verification of the plasma processing apparatus without releasing the processing chamber 101 in the atmosphere. A plasma processing method in the plasma processing apparatus of the third embodiment includes procedures of performing the verification by using the verification means.

In FIG. 8, the plasma processing apparatus of the third embodiment is provided with ammeters 801 and 802 and a control device 803 as constituent elements of the above-mentioned verification means. The ammeters 801 and 802 measure an electric current flowing from the variable DC power sources 112 and 113 to the wafer 103, and are connected to the control device 803. The control device 803 is provided in place of the above-mentioned control device 115, and includes a function of controlling the verification. The control device 803 controls the output voltage values of the variable DC power sources 112 and 113 so that electric currents measured by the ammeters 801 and 802 become equal to each other.

Ammeters to detect an electric current flowing from the electrostatic chuck electrodes 109 and 110 in the mounting stage 102 to the wafer 103 via the dielectric layer 111 may be provided as the ammeters 801 and 802 in particular.

The plasma processing apparatus of the third embodiment generates verification plasma 804, which is the plasma for the verification, inside the processing chamber 101 when performing the verification. The plasma discharging of this verification plasma 804 is hereafter referred to as verification discharging.

[Equivalent Circuit]

Figure 9:
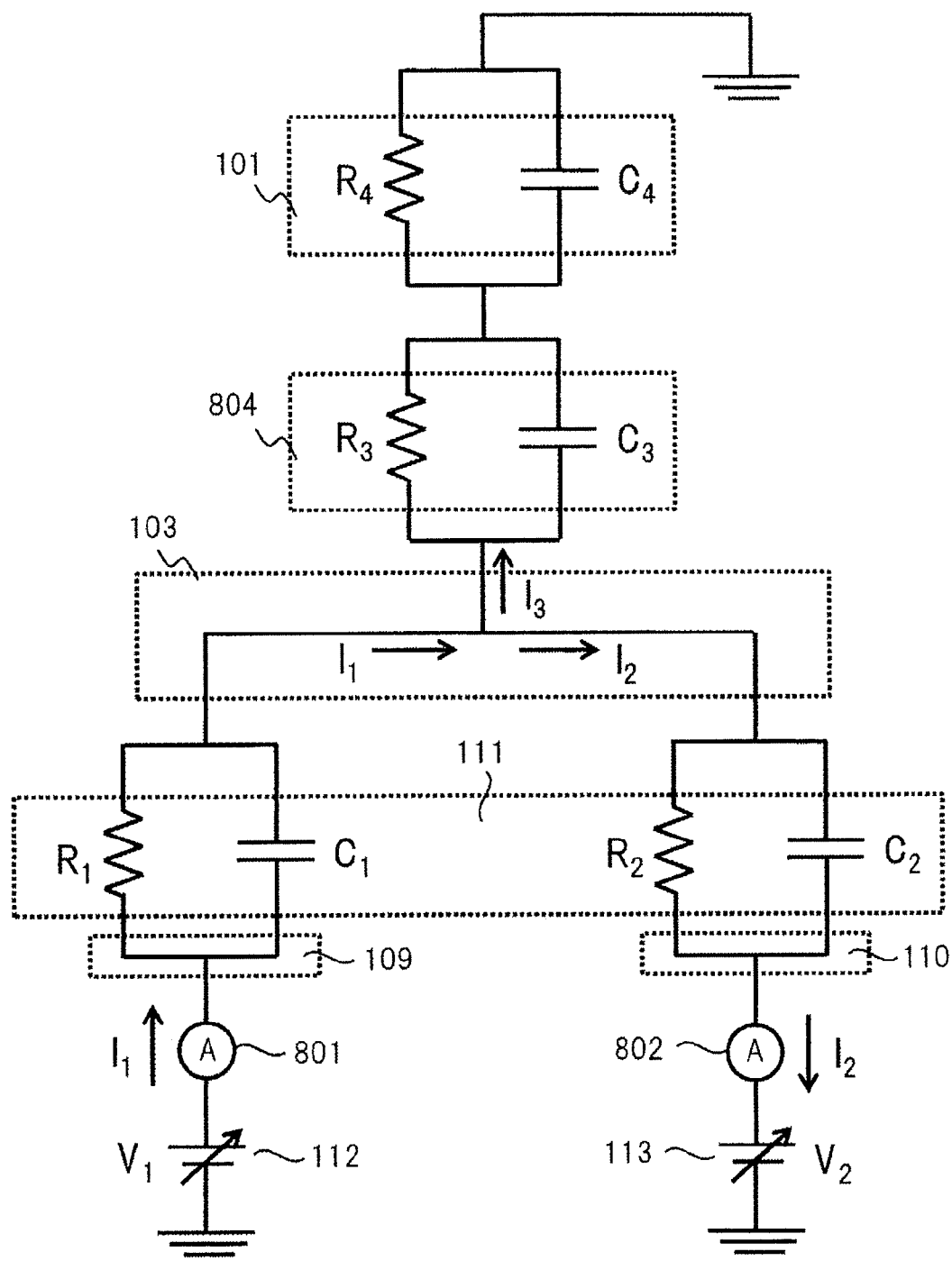
FIG. 9 is a diagram illustrating an equivalent circuit in which a variable DC power source, electrostatic chuck electrodes, a dielectric layer, a wafer, verification plasma and a processing chamber in the plasma processing apparatus of the third embodiment are modeled.

FIG. 9 illustrates an equivalent circuit in which the variable DC power sources 112 and 113, the electrostatic chuck electrodes 109 and 110, the dielectric layer Ell, the wafer 103, the verification plasma 804 and the vacuum processing chamber 101 during verification discharging in the plasma processing apparatus of the third embodiment are simply modeled. $I_1$ denotes an electric current of the ammeter 801, and $I_2$ denotes an electric current of the ammeter 802. $I_3$ denotes an electric current from the wafer 103 to the verification plasma 804. $R_3$ denotes a resistance value of the verification plasma 804, and $C_3$ denotes an electrostatic capacitance value of the verification plasma 804. $R_4$ denotes a grounding resistance of the inner wall surface 101a of the processing chamber 101, and $C_4$ denotes an earth electrostatic capacitance of the inner wall surface 101a of the processing chamber 101.

During the verification discharging, the wafer 103 and the inner wall surface 101a of the processing chamber 101 are electrically connected by the verification plasma 804. At this time, the resistance value $R_3$ and the electrostatic capacitance value $C_3$ between the wafer 103 and the inner wall surface 101a of the processing chamber 101 via the plasma are sufficiently small as compared with the resistance values $R_1$ and $R_2$ and the electrostatic capacitance values $C_1$ and $C_2$ between the wafer 103 and the electrostatic chuck electrodes 109 and 110.

In addition, in the plasma processing apparatus of the third embodiment, the grounding resistance $R_4$ and the earth electrostatic capacitance $C_4$ of the inner wall surface 101a of the processing chamber 101 are sufficiently small as compared with the resistance values $R_1$ and $R_2$ and the electrostatic capacitance values $C_1$ and $C_2$ mentioned above. Therefore, the electric potential of the wafer 103 becomes approximately 0 V during the verification discharging.

In addition, when the electric current $I_3$ flows in the verification plasma 804, $I_1$ and $I_2$ that are different electric currents flow in the ammeter 801 and the ammeter 802. In the plasma processing apparatus of the third embodiment, output voltage values $V_1$ and $V_2$ are set by the control device 803 so that values of these electric currents become equal to each other. By this setting, the flow of the electric current $I_3$ in the verification plasma 804 stops. More specifically, it reaches the state equal to the equivalent circuit in the case of no plasma discharge. $V_1$ and $V_2$ that are output voltage values of the variable DC power sources 112 and 113 determined in the above-mentioned manner become $V_{1ctrl}$ and $V_{2ctrl}$ that are output voltages with which the electric potential of the wafer 103 becomes 0 V also when there is no plasma discharge.

The plasma processing apparatus of the third embodiment performs the verification discharging at necessary unit and timing such as every processing for one wafer or every lot. In the verification discharging, the wafer 103 is first carried on the mounting stage 102 in the vacuum processing chamber 101. The wafer 103 is chucked on the mounting stage 102 by the electrostatic chuck electrodes 109 and 110. A chucking voltage at this time is set to a value generally used when processing of a product wafer is performed.

The plasma processing apparatus then prepares for the verification discharging, for example, pressure adjustment in the processing chamber 101. After the preparations are completed, the plasma processing apparatus generates the plasma by applying a predetermined microwave electric power for plasma generation. After the plasma generation, an electric current is measured by the ammeters 801 and 802. The control device 803 monitors $I_1$ and $I_2$ that are current values of the above-mentioned ammeters 801 and 802. The control device 803 controls $V_1$ and $V_2$ that are output voltages of the variable DC power sources 112 and 113 so that a difference between the current values $I_1$ and $I_2$ becomes within ±1% with respect to the sum of absolute values of the current values. Note that the output voltages of the variable DC power sources 112 and 113 are changed by an equal amount like the above-mentioned case.

When the difference of the current values mentioned above becomes within ±1% of the sum of absolute values of the current values in the above-mentioned control, the control device 803 stops the control of the output voltages of the variable DC power sources 112 and 113 and stores the values of $V_1$ and $V_2$ that are the output voltage values at that time in the storage device 114. The values of $V_1$ and $V_2$ stored here become $V_{1ctrl}$ and $V_{2ctrl}$ mentioned above.

Note that the difference of the current values mentioned above that is the condition at the time of stopping the control of the output voltages of the variable DC power sources 112 and 113 during the above-mentioned verification discharging is not limited to within ±1% of the sum of absolute values of the current values. However, it is desired that an electric potential difference between the wafer 103 and the inner wall surface 101a can be sufficiently reduced so that an effect of reducing foreign substances can be acquired as mentioned above.

In the third embodiment, the reason why the condition of stopping the control mentioned above is set to that the difference of the current values is within ±1% of the sum of absolute values of the current values is as follows. An electric potential difference between the electrostatic chuck electrode 109 and the electrostatic chuck electrode 110 in the first embodiment is 1000 V. With respect to this electric potential difference of 1000 V, the allowable electric potential difference between the wafer 103 and the inner wall surface 101a capable of acquiring an effect of reducing the foreign substances is ±10 V. The allowable electric potential difference of ±10 V is ±1% of 1000 V that is an electric potential difference between the electrostatic chuck electrode 109 and the electrostatic chuck electrode 110 mentioned above. Therefore, the condition that the difference of the current values is within ±1% of the sum of absolute values of the current values is determined as the condition of stopping the control mentioned above.

The plasma processing apparatus performs processing of the product wafer after the verification. The plasma processing apparatus controls output voltage values of the variable DC power sources 112 and 113 so as to be $V_{1ctrl}$ and $V_{2ctrl}$ in the same manner as (c) of FIG. 4 mentioned above during interruption of the plasma discharge by the control device 803 in the processing of the product wafer.

[Effects Etc.]

As mentioned above, according to the plasma processing method of the plasma processing apparatus of the third embodiment, the verification is carried out without releasing the processing chamber 101 in the atmosphere. Also, according to this plasma processing method, it is possible to suppress the occurrence of an unintended electric potential difference between the wafer 103 and the inner wall surface 101a of the processing chamber 101 during interruption of the plasma discharge in the processing of the product wafer. Thus, the adhesion of charged foreign substances to the wafer 103 can be reduced.

Fourth Embodiment

A plasma processing apparatus of the fourth embodiment of the present invention will be described with reference to FIGS. 10 and 11. Hereinafter, a part of the configuration of the fourth embodiment which is different from those of the above-mentioned embodiments will be described.

[Plasma Processing Apparatus]

Figure 10:
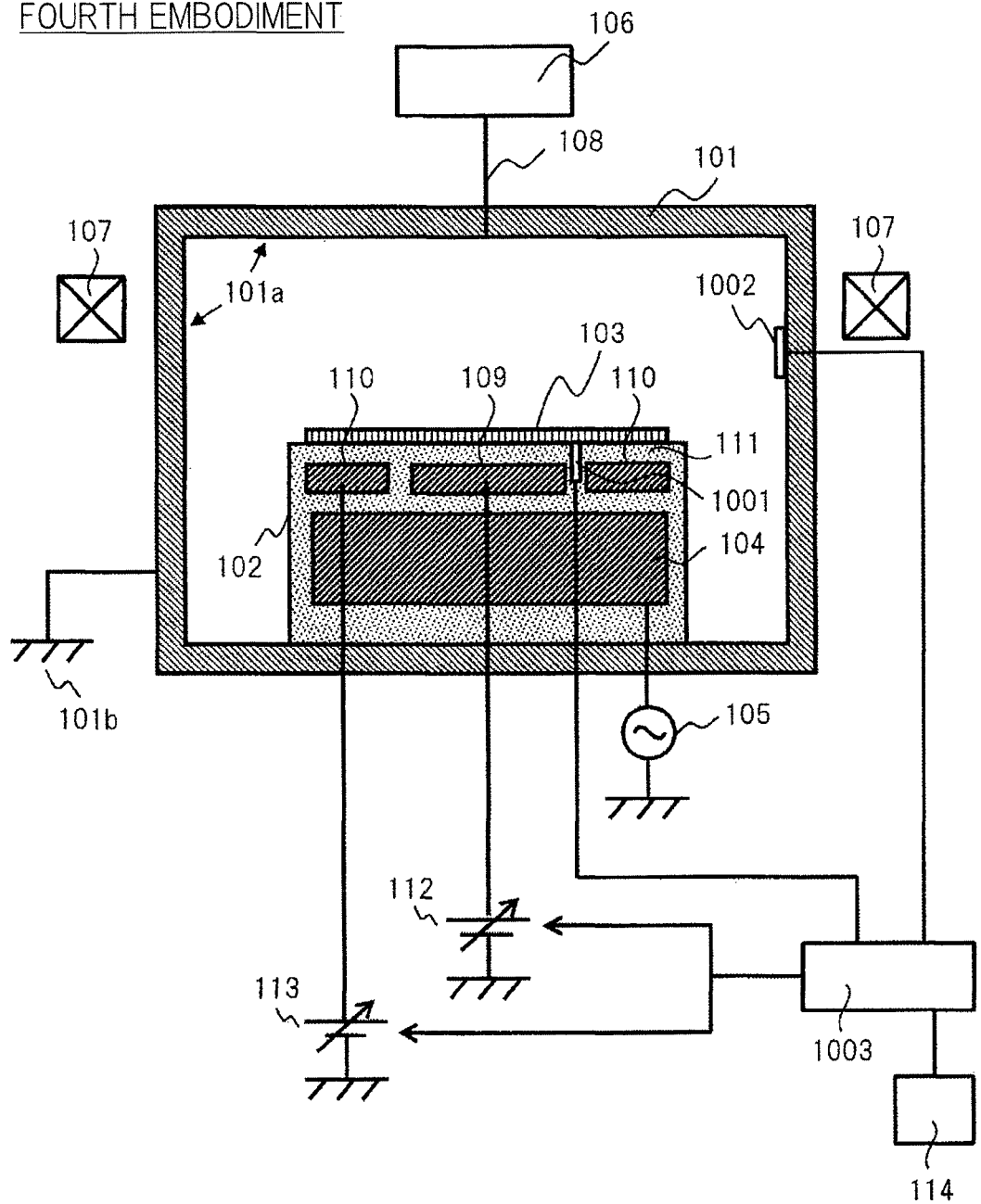
FIG. 10 is a diagram illustrating a cross-sectional configuration of a main part of a plasma processing apparatus of the fourth embodiment.

FIG. 10 illustrates a cross-sectional configuration of a main part of the plasma processing apparatus of the fourth embodiment. Although the plasma processing apparatus of the fourth embodiment of FIG. 10 is also an ECR etching apparatus, the plasma processing apparatus is applicable without being limited to the ECR etching apparatus. The plasma processing apparatus of the fourth embodiment is provided with a wafer potential measurement probe 1001, an inner wall surface potential measurement probe 1002 and a control device 1003 in addition to the above-mentioned constituent elements.

The wafer potential measurement probe 1001 is a probe which measures an electric potential of the wafer 103 in the processing chamber 101. The inner wall surface potential measurement probe 1002 is a probe which measures an electric potential of the inner wall surface 101a of the processing chamber 101.

The control device 1003 is provided in place of the control device 115, and has a function to monitor an electric potential measurement result of the wafer potential measurement probe 1001 and the inner wall surface potential measurement probe 1002 and control the output voltages of the variable DC power sources 112 and 113 based on the result.

In the fourth embodiment, a base material of the inner wall surface 101a of the processing chamber 101 is, for example, a grounded conductor like the case mentioned above. Without being limited to this, the fourth embodiment is suitably applicable also to the case where the base material of the inner wall surface 101a is not grounded, the case where the base material is not a conductor, and others.

The base material of the inner wall surface 101a mentioned above may be exposed to the plasma. In the case where the base material is grounded, it may have a thin dielectric film which makes the inner wall surface 101a have approximately 0 V promptly after the plasma disappears. Furthermore, the fourth embodiment is suitably applicable also to the case where the dielectric film of the base material of the inner wall surface 101a is thick and a time constant of the change of an electric potential ranges from several seconds to tens of seconds or longer.

In the fourth embodiment, the dielectric layer 111 between the electrostatic chuck electrodes 109 and 110 and the wafer 103 may have a resistivity with which a certain amount of leakage current can flow or a resistivity with which leakage current hardly flows. For example, the dielectric layer 111 may be a sprayed film for chucking a wafer based on a Johnsen-Rahbek effect mentioned above, and may be a sintered body whose resistivity is approximately $10^5$ to $10^6$ times of it.

In the plasma processing method in the plasma processing apparatus of the fourth embodiment, an electric potential of the wafer 103 and an electric potential of the inner wall surface 101a are measured during interruption of the plasma discharge by using the wafer potential measurement probe 1001 and the inner wall surface potential measurement probe 1002. The control device 1003 monitors measurement result of these probes. The control device 1003 controls the output voltages of the variable DC power sources 112 and 113 based on the measurement results of the electric potential of the wafer 103 and the electric potential of the inner wall surface 101a so that the electric potential difference between the wafer 103 and the inner wall surface 101a is reduced. Note that, in the fourth embodiment, the output voltages of the variable DC power sources 112 and 113 are changed by an equal amount like the above-mentioned case.

The plasma processing apparatus of the fourth embodiment eliminates the electric potential difference between the wafer 103 and the inner wall surface 101a of the processing chamber 101 during interruption of the plasma discharge by performing the above-mentioned control with the control device 1003. In this manner, charged foreign substances are prevented from being attracted and adhering to the wafer 103.

[Processing Time Chart]

FIG. 11 illustrates a time chart of the processing including the plasma processing in the plasma processing apparatus of the fourth embodiment in the same manner as the above-mentioned case. The processing of FIG. 11 is different from that of FIG. 4 mentioned above in the shape of (c) and (d) in the time period T2 during interruption of the plasma discharge.

In the output voltages of variable DC power sources of (c) in FIG. 11, 1101 denotes a predetermined positive voltage serving as a reference of the output voltage of the variable DC power source 112 to the electrostatic chuck electrode 109 on the inside. 1102 denotes a predetermined negative voltage serving as a reference of the output voltage of the variable DC power source 113 to the electrostatic chuck electrode 110 on the outside. 1100 denotes a change of an output voltage and its time period by the control of the control device 1003 within the time period T2 during interruption of discharging. The control device 1003 performs the control to change the output voltage values of the variable DC power source 112 and the variable DC power source 113 in the time period 1100.

In the time period 1100, the output voltage 1101 of the variable DC power source 112 changes like 1101a, and the output voltage 1102 of the variable DC power source 113 changes like 1102a. In 1101a, an electric potential gradually increases, so that a state lower by a predetermined voltage with respect to the voltage value of 1101 changes to reach a state higher by a predetermined voltage with respect to the voltage value of 1101. Similarly, in 1102a, an electric potential gradually increases, so that a state lower by a predetermined voltage with respect to the voltage value of 1102 changes to reach a state higher by a predetermined voltage with respect to the voltage value of 1102.

In the wafer electric potential and the inner wall surface electric potential of (d) in FIG. 11, 1111 denotes the electric potential of the wafer 103 and 1112 denotes the electric potential of the inner wall surface 101a. At the time t1 where discharging in the time period T1 is completed, 1111 and 1112 have the same electric potential as mentioned above. In the time period T2, the electric potential 1111 of the wafer 103 changes like 1111a. 1111a has a shape in which the electric potential is once slightly reduced and then gradually comes close to 0 V in the time period of 1100. Similarly, the electric potential 1112 of the inner wall surface 101a changes like 1112a. 1112a has a shape in which a potential gradually comes close to 0 V in the time period of 1100. Although there is an electric potential difference between 1111 and 1112 immediately after the time t1, the electric potential difference then becomes approximately 0 V. In the time period of 1100, the electric potential difference between 1111a and 1112a is approximately 0 V.

The plasma processing apparatus of the fourth embodiment prepares for a subsequent discharging process such as pressure adjustment in the processing chamber 101 in the same manner as mentioned above while controlling the output voltages of the variable DC power sources 112 and 113 with the control device 1003 in the time period T2 during interruption of discharging mentioned above. After the end of the preparations, the plasma processing apparatus stops the control of 1100 by the control device 1003. Thus, the variable DC power sources 112 and 113 output predetermined voltages for the subsequent discharging process. Thereafter, supply of the microwave electric power is started, and the subsequent discharging process is carried out in the same way.

The plasma processing apparatus of the fourth embodiment is configured to continue the control of the output voltages of the variable DC power sources 112 and 113 so that the electric potential difference between the wafer 103 and the inner wall surface 101a becomes small.

Without being limited to this, the configuration in which the output voltages mentioned above are controlled so that the electric potential difference between the wafer 103 and the inner wall surface 101a becomes within a predetermined value may be applicable. In the case of this configuration, the electric potential difference between the wafer 103 and the inner wall surface 101a may be controlled so as to be within ±10 V by using a value determined as the standard capable of acquiring the effect of reducing the adhesion of foreign substances in the first embodiment mentioned above.

[Effects Etc.]

As mentioned above, according to the plasma processing method in the plasma processing apparatus of the fourth embodiment, it is possible to suppress the occurrence of an unintended electric potential difference between the wafer 103 and the inner wall surfaces 101a during interruption of the plasma discharge in the processing of the product wafer, and the adhesion of foreign substances to the wafer 103 can be reduced.

In the foregoing, the present invention has been specifically described based on the embodiments, and the present invention relates to the plasma processing apparatus which controls the output voltages of the variable DC power sources to the wafer chucking electrodes so that an electric potential difference between the wafer and the inner wall surface of the processing chamber is reduced in the case where the wafer is mounted on the wafer mounting stage and plasma is not generated.

Note that the present invention is not limited to the foregoing embodiments and various modifications and alterations can be made within the scope of the present invention. For example, the embodiments above have been described in detail so as to make the present invention easily understood, and the present invention is not limited to the embodiment having all of the described constituent elements. Also, a part of the configuration of one embodiment may be replaced with the configuration of another embodiment, and the configuration of one embodiment may be added to the configuration of another embodiment. Furthermore, another configuration may be added to a part of the configuration of each embodiment, and a part of the configuration of each embodiment may be eliminated or replaced with another configuration.

For example, "the case where the wafer is mounted on the wafer mounting stage and plasma is not generated" mentioned above includes not only the period during interruption of the plasma discharge in the first to fourth embodiments, but also the period until the first plasma discharge is started after the wafer is carried into the processing chamber.

In addition, in each embodiment, when the average value of the output voltages of the variable DC power source 112 and the variable DC power source 113 is changed, the output voltages are changed by an equal amount in both of the variable DC power source 112 and the variable DC power source 113. As for the voltage change, the output voltages may be changed by different amounts in the variable DC power source 112 and the variable DC power source 113. For example, when the average value of the output voltages of the variable DC power sources 112 and 113 is changed by +10 V from a state where the output voltage of the variable DC power source 112 is +500 V and the output voltage of the variable DC power source 113 is −500 V, it is also possible to set the output voltage of the variable DC power source 112 to +520 V and set the output voltage of the variable DC power source 113 to −500 V.

Furthermore, although the case where the output voltage values of the variable DC power source 112 and the variable DC power source 113 are changed has been described in each of the embodiments, it is not always necessary to change the voltage values of both of them, and the electric potential difference between the inner wall surface of the processing chamber and the wafer may be controlled to 0 V by the output voltage value of at least one of the variable DC power source 112 and the variable DC power source 113. Note that the case where the output voltage values of the variable DC power source 112 and the variable DC power source 113 are both changed can electrostatically chuck the wafer to the sample stage more stably than the case where only one of output voltage values of the variable DC power source 112 and the variable DC power source 113 is changed.

In addition, for example, although the plasma processing apparatus in the fourth embodiment is provided with the inner wall surface potential measurement probe which measures the wall surface potential, when it is guessed that an electric potential of the inner wall surface promptly becomes 0 V during plasma interruption as described in the first to third embodiments, the present invention may have the configuration which is not provided with the inner wall surface potential measurement probe. Further, also when the inner wall surface potential during plasma interruption has been measured and grasped in advance, the present invention may have the configuration which is not provided with the inner wall surface potential measurement probe.

Furthermore, for example, when the inner wall surface is charged by plasma and the electric potential thereof can be guessed surely from plasma parameters, the present invention may have the configuration which is not provided with the inner wall surface potential measurement probe. In addition, also when an electric potential is generated on the inner wall surface due to various factors other than the above-mentioned examples and the electric potential can be guessed surely by a method other than the direct measurement of the inner wall surface potential, the present invention may have the configuration which is not provided with the inner wall surface potential measurement probe.

As mentioned above, a technical idea of the present invention is "to reduce an electric potential difference between an electric potential of the sample and an electric potential of the inner wall of the plasma processing chamber in the case where plasma does not exist". Also, when an electric potential of the inner wall of the plasma processing chamber is approximately 0 V, it is possible to express that the technical idea of the present invention is "to reduce an electric potential of the sample in case where plasma does not exist". In addition, the present invention can be modified variously in the range without departing from the gist of the technical idea of the present invention mentioned above.

Furthermore, the present invention includes also a configuration in which a voltage value of a DC power source calculated in advance as a voltage value of a DC power source for reducing an electric potential difference between an electric potential of the sample and an electric potential of the inner wall of the plasma processing chamber in the case where plasma does not exist is output as an output value of the DC power source in the case where plasma does not exist. In addition, the present invention includes also a configuration in which a voltage value of a DC power source calculated in advance as a voltage value of a DC power source for reducing an electric potential of the sample in the case where plasma does not exist is output as an output value of the DC power source in the case where plasma does not exist.

What is claimed is:

1. A plasma processing apparatus, comprising:
a processing chamber in which plasma processing of a sample is carried out by using plasma;
a radio frequency power source which supplies a radio frequency power for generating the plasma;
a sample stage in which a first electrode and a second electrode which electrostatically chuck the sample are arranged and on which the sample is mounted;
a DC power source which applies a first DC voltage and a second DC voltage to the first and second electrodes, the first DC voltage being a positive DC voltage value, and the second DC voltage being a negative DC voltage value; and
a controller configured to:
control the DC power source to apply a predetermined positive output voltage value to the first electrode during a plasma discharging period, and to apply a predetermined negative output voltage value to the second electrode during the plasma discharging period;
control the DC power source to apply the first DC voltage to the first electrode to cause the first DC voltage to be a higher voltage than the predetermined positive output voltage value during a stepped-up voltage time period; and
control the DC power source to apply the second DC voltage to the second electrode to cause the second DC voltage to be a higher voltage than the predetermined negative output voltage value during the stepped-up voltage time period such that the first DC voltage value and the second DC voltage value act in cooperation to reduce an electric potential difference between an electric potential of the sample and an electric potential present at an inner wall surface of the processing chamber during the stepped-up voltage time period which occurs within a discharge interruption time period, the discharge interruption time period occurring between two or more plasma discharging periods,
wherein the radio frequency power source does not output the radio frequency power during the discharge interruption time period,
wherein the first DC voltage value and the second DC voltage value are obtained based on a resistance value between the sample and the first electrode and a resistance value between the sample and the second electrode,
wherein the resistance value between the sample and the first electrode is different from the resistance value between the sample and the second electrode, and
wherein the stepped-up voltage time period is shorter than the discharge interruption time period, and begins after the start of the discharge interruption time period and ends before the end of the discharge interruption time period.

2. The plasma processing apparatus according to claim 1, wherein the DC power source is provided with a first DC power source and a second DC power source.

3. The plasma processing apparatus according to claim 1, wherein the electric potential of the sample ranges from −10 V to +10 V.

4. A plasma processing apparatus, comprising:
a processing chamber in which plasma processing of a sample is carried out by using plasma;
a radio frequency power source which supplies a radio frequency power for generating the plasma;
a sample stage in which an electrode which electrostatically chucks the sample is arranged and on which the sample is mounted;
a DC power source which applies DC voltage to the electrode; and
a controller configured to:

control the DC power source to apply a predetermined output voltage to the electrode during a plasma discharging period;
control the DC power source to apply a DC voltage to the electrode which is a higher voltage than the predetermined output voltage during a stepped-up voltage time period, the DC voltage having a voltage value which reduces an electric potential difference between an electric potential of the sample and an electric potential of an inner wall of the processing chamber during the stepped-up voltage time period which occurs within a discharge interruption time period, the discharge interruption time period occurring between two or more plasma discharging periods; and
control the DC power source to apply the predetermined output voltage to the electrode after the discharge interruption time period,
wherein the radio frequency power source does not output the radio frequency power during the discharge interruption time period; and
wherein the stepped-up voltage time period is shorter than the discharge interruption time period, and begins after the start of the discharge interruption time period and ends before the end of the discharge interruption time period.

5. The plasma processing apparatus according to claim 4, wherein the electric potential difference between the electric potential of the sample and the electric potential of the inner wall of the processing chamber ranges from −10 V to +10 V.

6. A plasma processing apparatus, comprising:
a processing chamber in which plasma processing of a sample is carried out by using plasma;
a radio frequency power source which supplies a radio frequency power for generating the plasma;
a sample stage in which a first electrode and a second electrode which electrostatically chuck the sample are arranged and on which the sample is mounted;
a DC power source which applies a first DC voltage and a second DC voltage to the first and second electrodes, the first DC voltage being a positive DC voltage value, and the second DC voltage being a negative DC voltage value; and
a controller configured to:
control the DC power source to apply a predetermined positive output voltage value to the first electrode during a plasma discharging period, and to apply a predetermined negative output voltage value to the second electrode during the plasma discharging period;
control the DC power source to apply the first DC voltage to the first electrode to cause the first DC voltage to be a higher voltage than the predetermined positive output voltage value during a stepped-up voltage time period;
control the DC power source to apply the second DC voltage to the second electrode to cause the second DC voltage to be a higher voltage than the predetermined negative output voltage value during the stepped-up voltage time period such that the first DC voltage value and the second DC voltage value act in cooperation to reduce an electric potential difference between an electric potential of the sample and an electric potential present at an inner wall surface of the processing chamber during the stepped-up voltage time period which occurs within a discharge interruption time period, the discharge interruption time period occurring between two or more plasma discharging periods, wherein the radio frequency power source does not output radio frequency power during the discharge interruption time period; and
control the DC power source to apply the predetermined positive output voltage value to the first electrode and to apply the predetermined negative output voltage value to the second electrode after the discharge interruption time period.

7. The plasma processing apparatus according to claim 6, wherein the electric potential of the inner wall of the processing chamber is 0 V.

* * * * *